(12) United States Patent
Silverbrook

(10) Patent No.: US 6,235,211 B1
(45) Date of Patent: *May 22, 2001

(54) METHOD OF MANUFACTURE OF AN IMAGE CREATION APPARATUS

(75) Inventor: Kia Silverbrook, Sydney (AU)

(73) Assignee: Silverbrook Research Pty Ltd, Balmain (AU)

( * ) Notice: Subject to any disclaimer, the term of this patent is extended or adjusted under 35 U.S.C. 154(b) by 0 days.

This patent is subject to a terminal disclaimer.

(21) Appl. No.: 09/112,798

(22) Filed: Jul. 10, 1998

(30) Foreign Application Priority Data

Jul. 15, 1997 (AU) ..................... PO7991
Dec. 12, 1997 (AU) ..................... PP0889

(51) Int. Cl.$^7$ .................................... B41J 2/04
(52) U.S. Cl. .................... 216/27; 347/56; 347/62
(58) Field of Search ................ 216/27; 347/56–62

(56) References Cited

U.S. PATENT DOCUMENTS 3,747,120 * 7/1973 Stemme ........................... 347/56

* cited by examiner

Primary Examiner—Randy Gulakowski
Assistant Examiner—Shamim Ahmed

(57) ABSTRACT

An ink jet printer includes a trough having side walls and an exposed roof, the trough being substantially filled with fluid during operation. A paddle vane is located within the trough and offset from one wall when the paddle vane is in a quiescent position. An actuation mechanism is attached to the paddle vane such that, upon activation of the actuation mechanism, the paddle vane is caused to move towards the wall, resulting in an increase in pressure in the fluid between the wall and the paddle vane. This results in a consequential ejection of fluid via the exposed roof. A method of manufacture of the ink jet printer comprises the steps of initially providing a silicon wafer having a circuitry wafer layer including electrical circuitry necessary for the operation of the thermal actuation mechanisms on demand. The trough is etched in the surface of the wafer. The actuation mechanism and the paddle vane are created on the silicon wafer by means of depositing and etching a series of sacrificial layers to form a supporting structure for the actuation mechanism and the paddle vane, in addition to depositing and suitably etching a series of materials for forming the actuation mechanism and the paddle vane. An ink supply channel interconnecting the trough with an ink supply is etched through the wafer. Any remaining sacrificial layers are etched away so as to release the actuation mechanism and the paddle vane for operation.

7 Claims, 20 Drawing Sheets

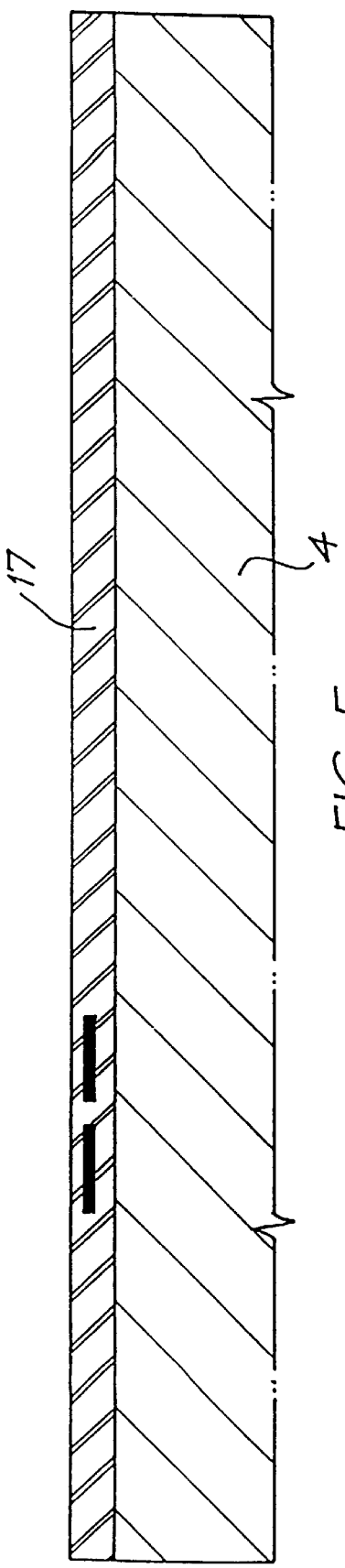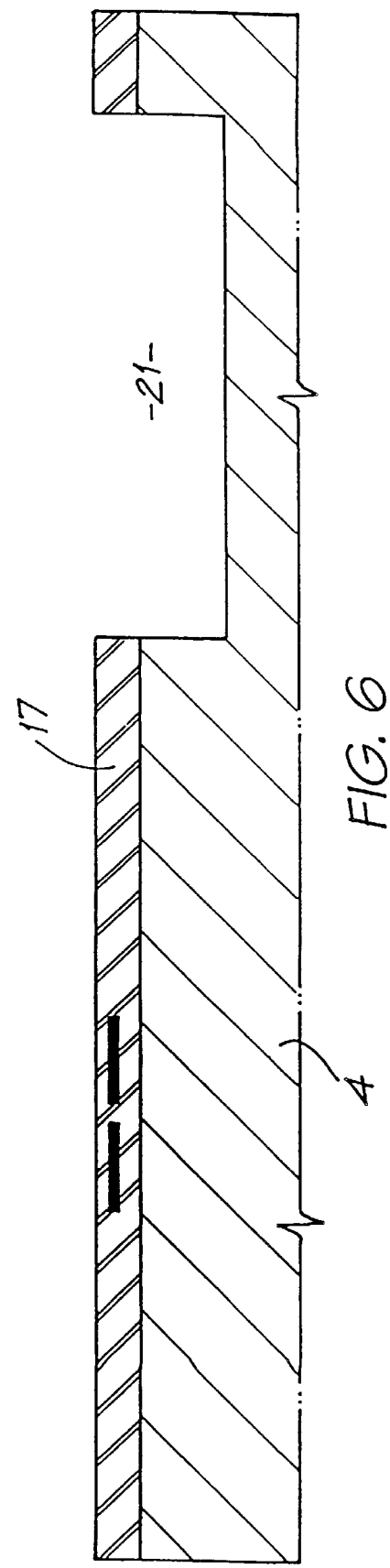
FIG. 5
FIG. 6

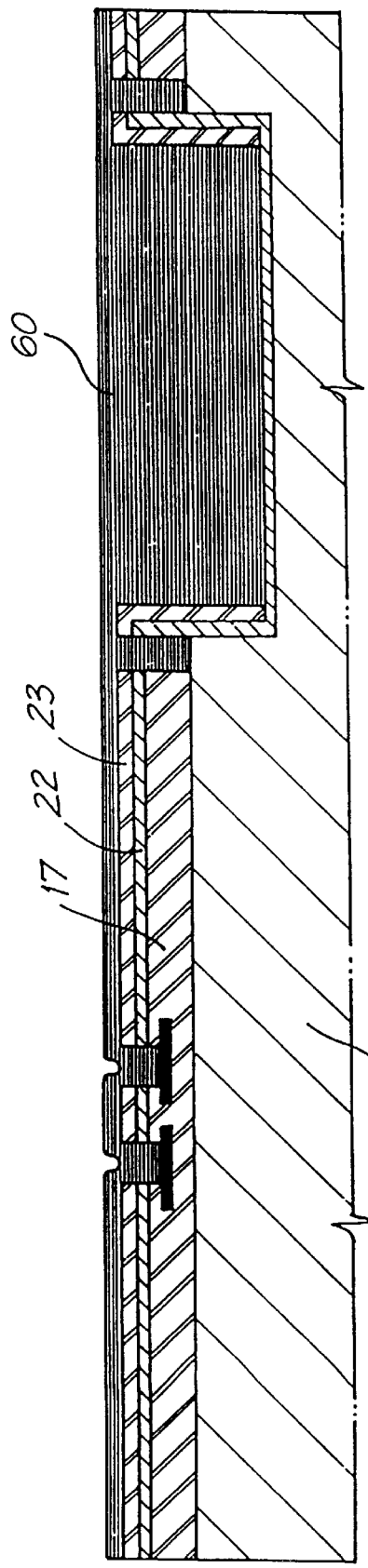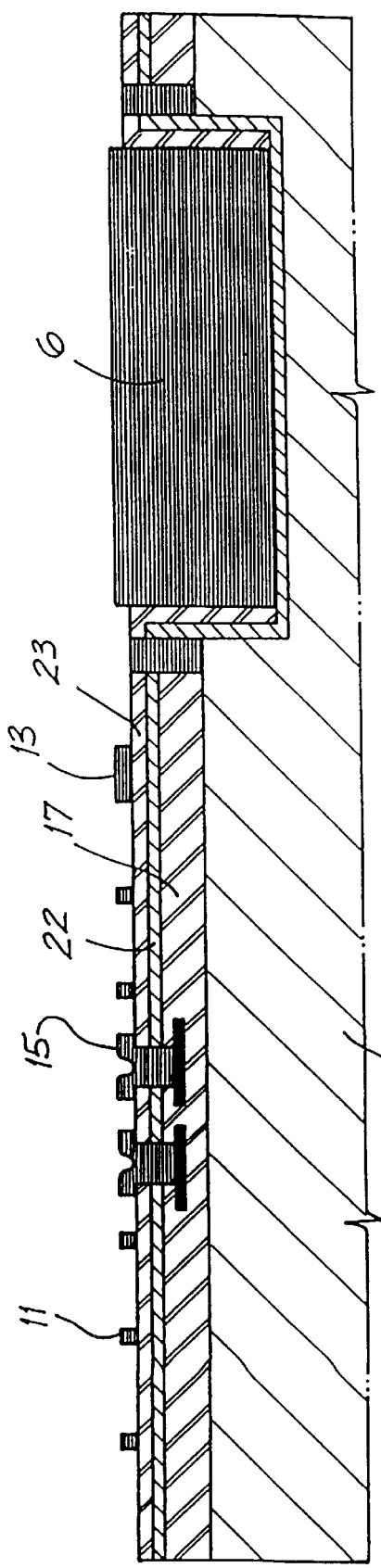

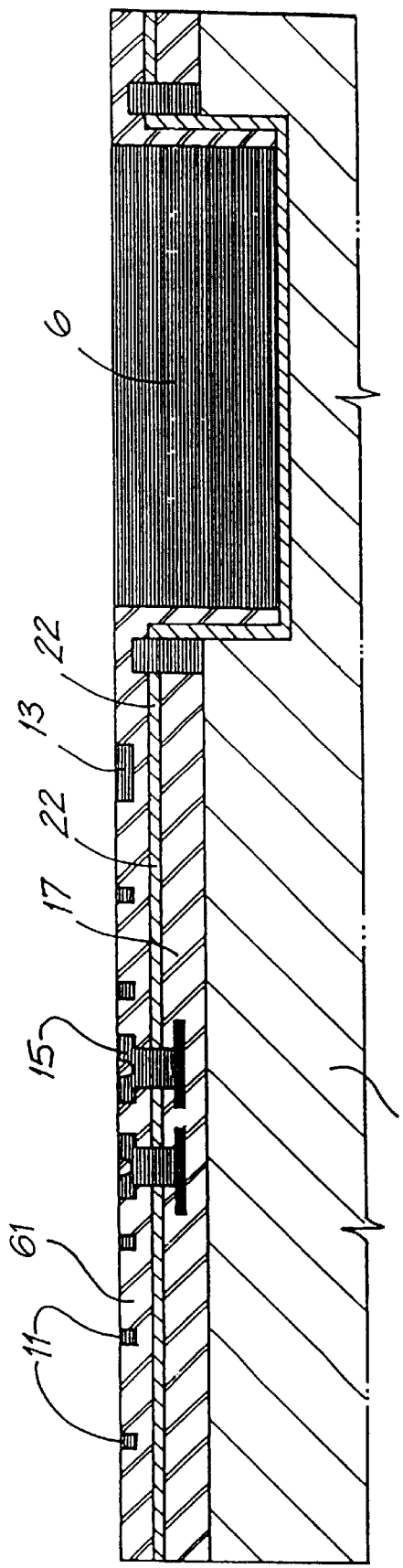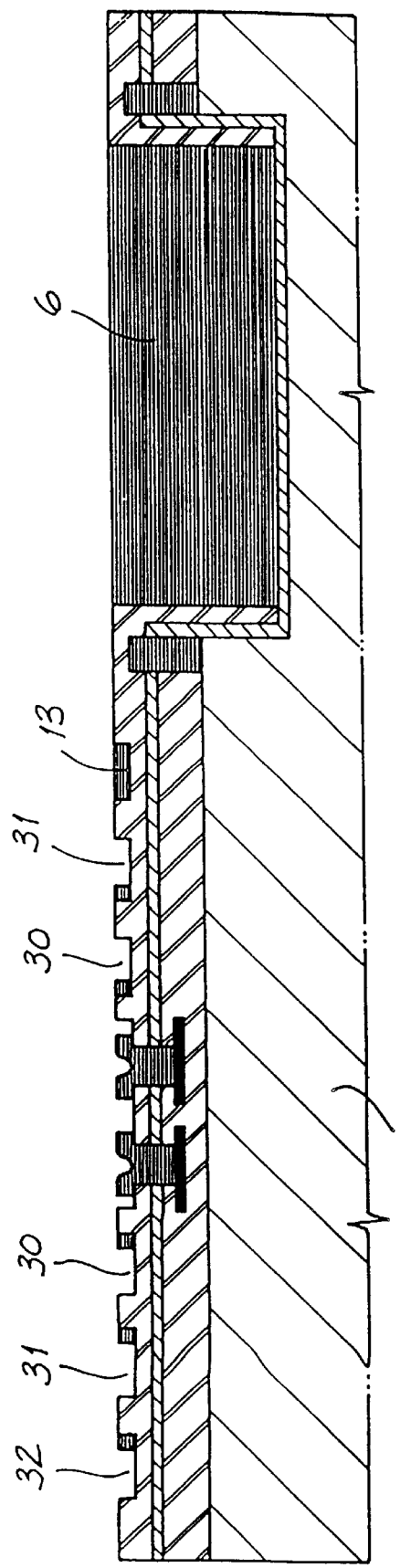

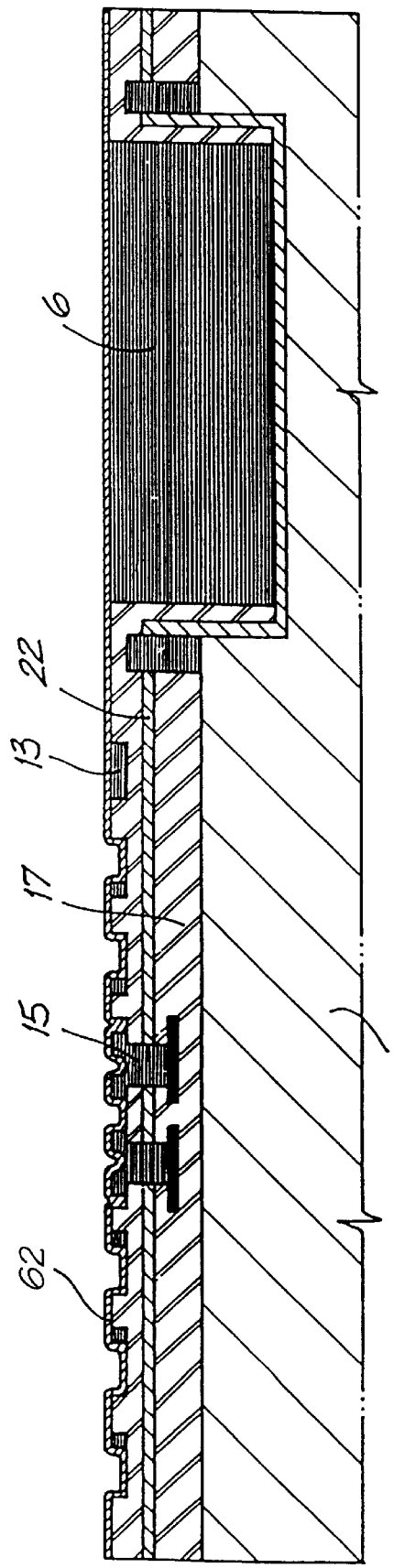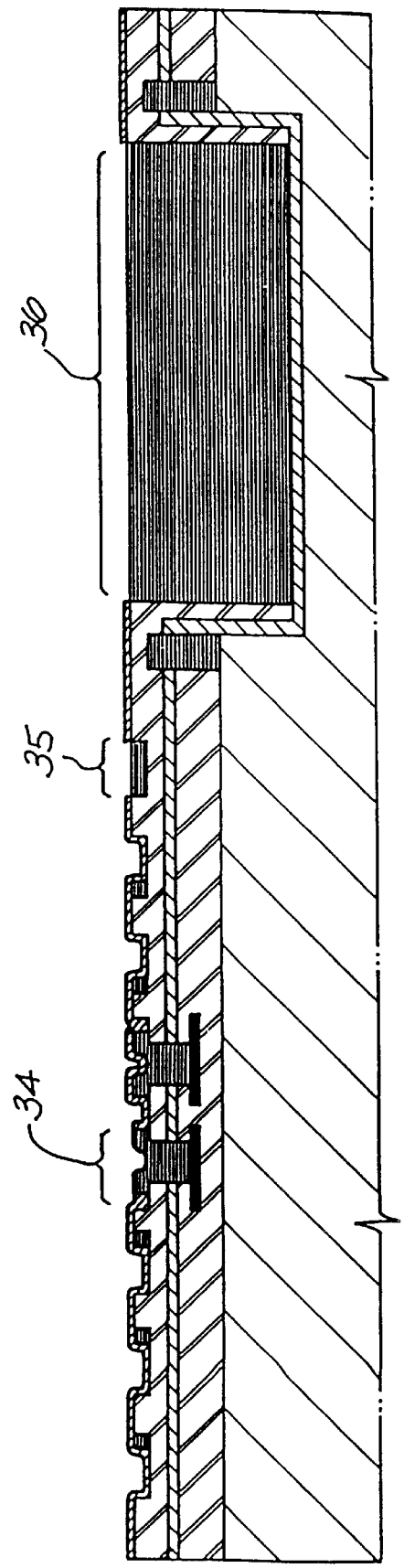

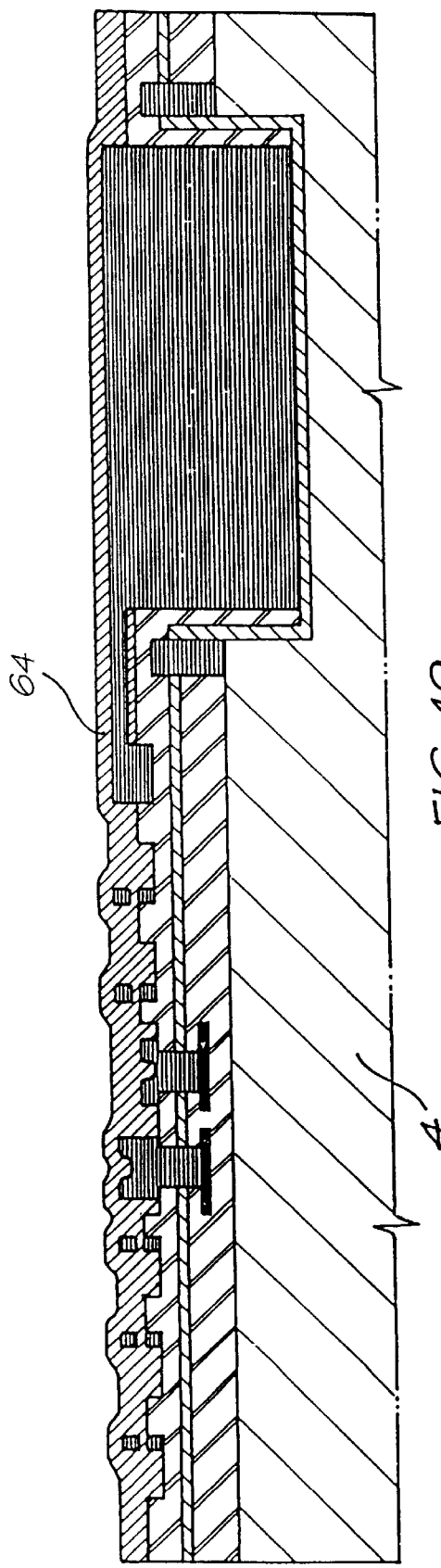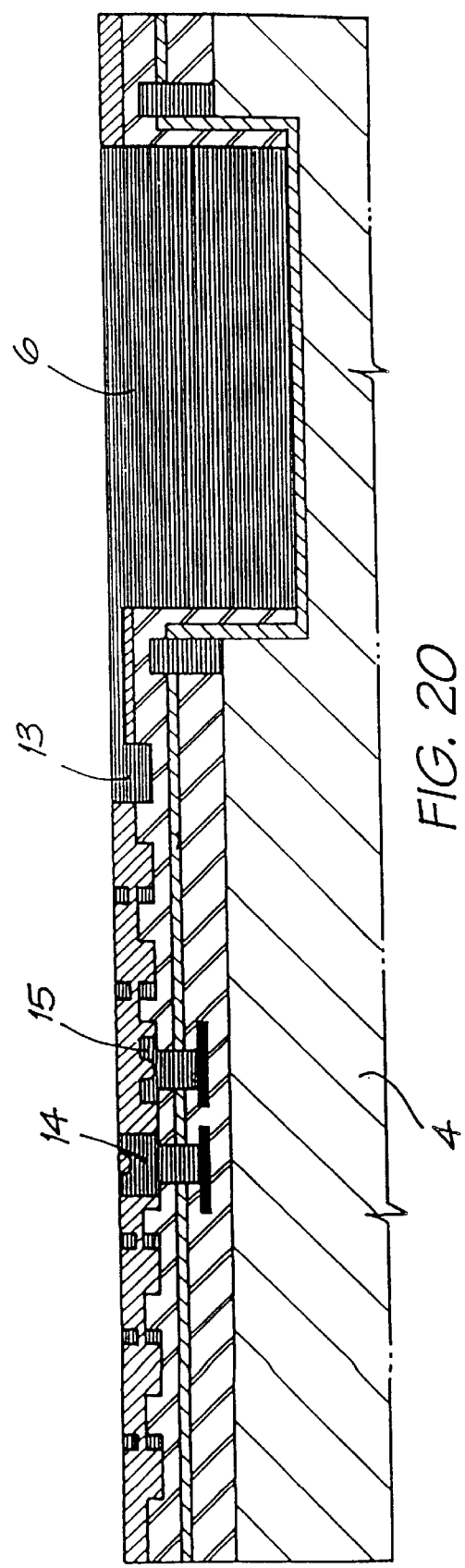

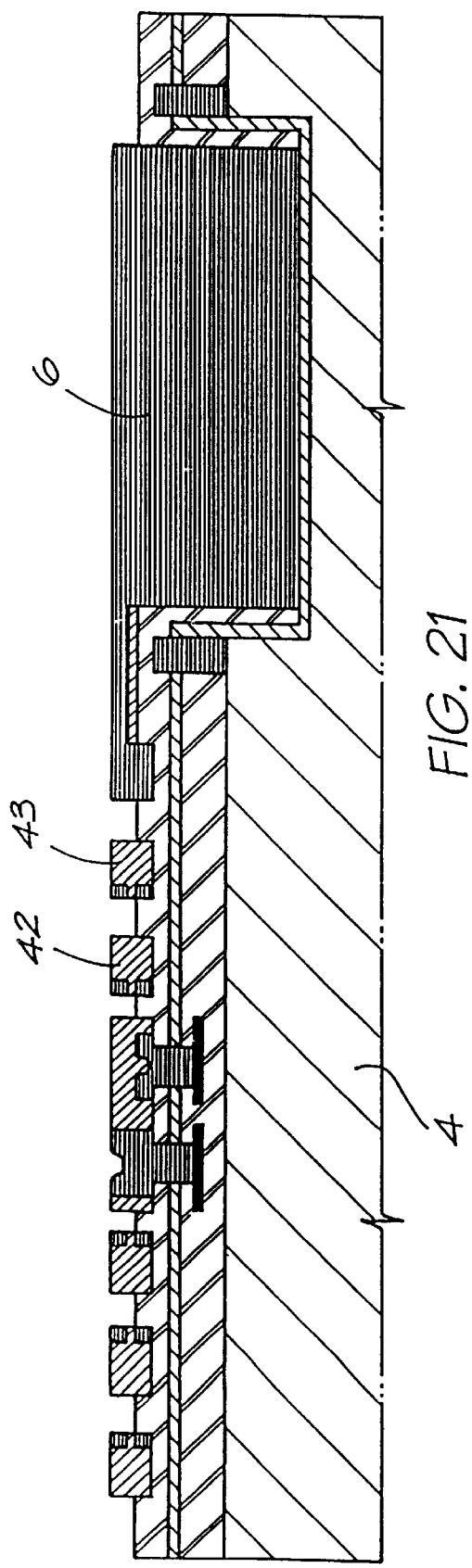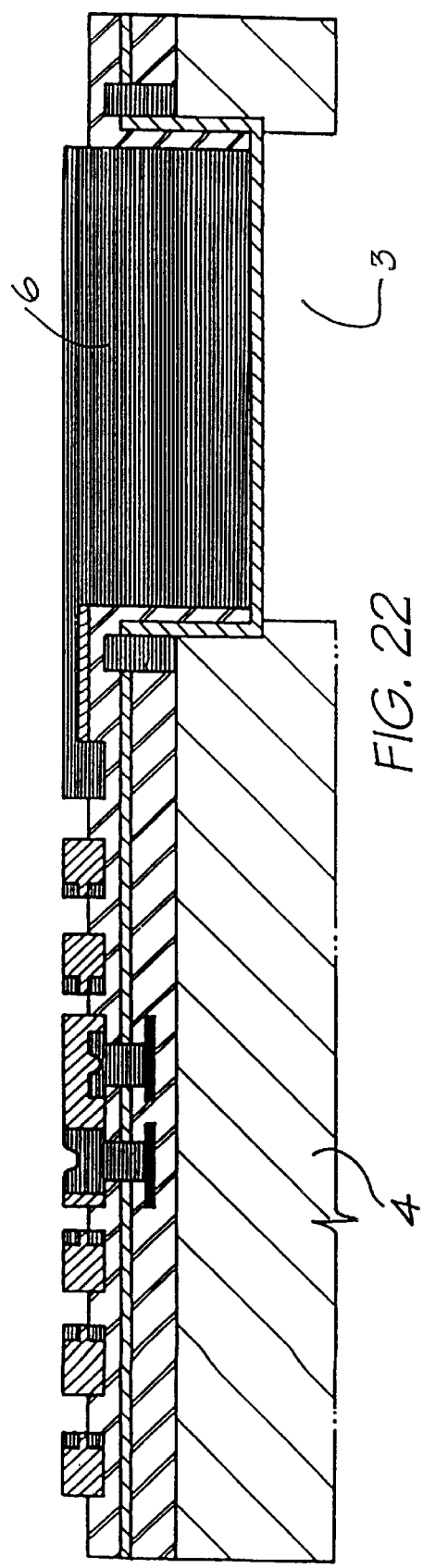
FIG. 21
FIG. 22

METHOD OF MANUFACTURE OF AN IMAGE CREATION APPARATUS

CROSS REFERENCES TO RELATED APPLICATIONS

The following Australian provisional patent applications are hereby incorporated by cross-reference. For the purposes of location and identification, U.S. patent applications identified by their U.S. patent application serial numbers (USSN) are listed alongside the Australian applications from which the U.S. patent applications claim the right of priority.

| CROSS-REFERENCED AUSTRALIAN PROVISIONAL PATENT NO. | U.S. patent application (CLAIMING RIGHT OF PRIORITY FROM AUSTRALIAN PROVISIONAL APPLICATION) | DOCKET NO. |
| --- | --- | --- |
| PO7991 | 09/113,060 | ART01 |
| PO8505 | 09/113,070 | ART02 |
| PO7988 | 09/113,073 | ART03 |
| PO9395 | 09/112,748 | ART04 |
| PO8017 | 09/112,747 | ART06 |
| PO8014 | 09/112,776 | ART07 |
| PO8025 | 09/112,750 | ART08 |
| PO8032 | 09/112,746 | ART09 |
| PO7999 | 09/112,743 | ART10 |
| PO7998 | 09/112,742 | ART11 |
| PO8031 | 09/112,741 | ART12 |
| PO8030 | 09/112,740 | ART13 |
| PO7997 | 09/112,739 | ART15 |
| PO7979 | 09/113,053 | ART16 |
| PO8015 | 09/112,738 | ART17 |
| PO7978 | 09/113,067 | ART18 |
| PO7982 | 09/113,063 | ART19 |
| PO7989 | 09/113,069 | ART20 |
| PO8019 | 09/112,744 | ART21 |
| PO7980 | 09/113,058 | ART22 |
| PO8018 | 09/112,777 | ART24 |
| PO7938 | 09/113,224 | ART25 |
| PO8016 | 09/112,804 | ART26 |
| PO8024 | 09/112,805 | ART27 |
| PO7940 | 09/113,072 | ART28 |
| PO7939 | 09/112,785 | ART29 |
| PO8501 | 09/112,797, PN 6,137,500 | ART30 |
| PO8500 | 09/112,796 | ART31 |
| PO7987 | 09/113,071 | ART32 |
| PO8022 | 09/112,824 | ART33 |
| PO8497 | 09/113,090 | ART34 |
| PO8020 | 09/112,823 | ART38 |
| PO8023 | 09/113,222 | ART39 |
| PO8504 | 09/112,786 | ART42 |
| PO8000 | 09/113,051 | ART43 |
| PO7977 | 09/112,782 | ART44 |
| PO7934 | 09/113,056 | ART45 |
| PO7990 | 09/113,059 | ART46 |
| PO8499 | 09/113,091 | ART47 |
| PO8502 | 09/112,753 | ART48 |
| PO7981 | 09/113,055 | ART50 |
| PO7986 | 09/113,057 | ART51 |
| PO7983 | 09/113,054 | ART52 |
| PO8026 | 09/112,752 | ART53 |
| PO8027 | 09/112,759 | ART54 |
| PO8028 | 09/112,757 | ART56 |
| PO9394 | 09/112,758 | ART57 |
| PO9396 | 09/113,107 | ART58 |
| PO9397 | 09/112,829 | ART59 |
| PO9398 | 09/112,792 | ART60 |
| PO9399 | 09/112,791, PN 6,106,147 | ART61 |
| PO9400 | 09/112,790 | ART62 |
| PO9401 | 09/112,789 | ART63 |
| PO9402 | 09/112,788 | ART64 |
| PO9403 | 09/112,795 | ART65 |
| PO9405 | 09/112,749 | ART66 |
| PP0959 | 09/112,784 | ART68 |
| PP1397 | 09/112,783 | ART69 |
| PP2370 | 09/112,781 | DOT01 |
| PP2371 | 09/113,052 | DOT02 |
| PO8003 | 09/112,834 | Fluid01 |
| PO8005 | 09/113,103 | Fluid02 |
| PO9404 | 09/113,101 | Fluid03 |
| PO8066 | 09/112,751 | IJ01 |
| PO8072 | 09/112,787 | IJ02 |
| PO8040 | 09/112,802 | IJ03 |
| PO8071 | 09/112,803 | IJ04 |
| PO8047 | 09/113,097 | IJ05 |
| PO8035 | 09/113,099 | IJ06 |
| PO8044 | 09/113,084 | IJ07 |
| PO8063 | 09/113,066 | IJ08 |
| PO8057 | 09/112,778 | IJ09 |
| PO8056 | 09/112,779 | IJ10 |
| PO8069 | 09/113,077 | IJ11 |
| PO8049 | 09/113,061 | IJ12 |
| PO8036 | 09/112,818 | IJ13 |
| PO8048 | 09/112,816 | IJ14 |
| PO8070 | 09/112,772 | IJ15 |
| PO8067 | 09/112,819 | IJ16 |
| PO8001 | 09/112,815 | IJ17 |
| PO8038 | 09/113,096 | IJ18 |
| PO8033 | 09/113,068 | IJ19 |
| PO8002 | 09/113,095 | IJ20 |
| PO8068 | 09/112,808 | IJ21 |
| PO8062 | 09/112,809 | IJ22 |
| PO8034 | 09/112,780 | IJ23 |
| PO8039 | 09/113,083 | IJ24 |
| PO8041 | 09/113,121 | IJ25 |
| PO8004 | 09/113,122 | IJ26 |
| PO8037 | 09/112,793 | IJ27 |
| PO8043 | 09/112,794 | IJ28 |
| PO8042 | 09/113,128 | IJ29 |
| PO8064 | 09/113,127 | IJ30 |
| PO9389 | 09/112,756 | IJ31 |
| PO9391 | 09/112,755 | IJ32 |
| PP0888 | 09/112,754 | IJ33 |
| PP0891 | 09/112,811 | IJ34 |
| PP0890 | 09/112,812 | IJ35 |
| PP0873 | 09/112,813 | IJ36 |
| PP0993 | 09/112,814 | IJ37 |
| PP0890 | 09/112,764 | IJ38 |
| PP1398 | 09/112,765 | IJ39 |
| PP2592 | 09/112,767 | IJ40 |
| PP2593 | 09/112,768 | IJ41 |
| PP3991 | 09/112,807 | IJ42 |
| PP3987 | 09/112,806 | IJ43 |
| PP3985 | 09/112,820 | IJ44 |
| PP3983 | 09/112,821 | IJ45 |
| PO7935 | 09/112,822 | IJM01 |
| PO7936 | 09/112,825 | IJM02 |
| PO7937 | 09/112,826 | IJM03 |
| PO8061 | 09/112,827 | IJM04 |
| PO8054 | 09/112,828 | IJM05 |
| PO8065 | 09/113,111, PN 6,071,750 | IJM06 |
| PO8055 | 09/113,108 | IJM07 |
| PO8053 | 09/113,109 | IJM08 |
| PO8078 | 09/113,123 | IJM09 |
| PO7933 | 09/113,114 | IJM10 |
| PO7950 | 09/113,115 | IJM11 |
| PO7949 | 09/113,129 | IJM12 |
| PO8060 | 09/113,124 | IJM13 |
| PO8059 | 09/113,125 | IJM14 |
| PO8073 | 09/113,126 | IJM15 |
| PO8076 | 09/113,119 | IJM16 |
| PO8075 | 09/113,120 | IJM17 |
| PO8079 | 09/113,221 | IJM18 |
| PO8050 | 09/113,116 | IJM19 |
| PO8052 | 09/113,118 | IJM20 |
| PO7948 | 09/113,117 | IJM21 |

-continued

| CROSS-REFERENCED AUSTRALIAN PROVISIONAL PATENT NO. | U.S. patent application (CLAIMING RIGHT OF PRIORITY FROM AUSTRALIAN PROVISIONAL APPLICATION) | DOCKET NO. |
|---|---|---|
| PO7951 | 09/113,113 | IJM22 |
| PO8074 | 09/113,130 | IJM23 |
| PO7941 | 09/113,110 | IJM24 |
| PO8077 | 09/113,112 | IJM25 |
| PO8058 | 09/113,087 | IJM26 |
| PO8051 | 09/113,074 | IJM27 |
| PO8045 | 09/113,089, PN 6,110,754 | IJM28 |
| PO7952 | 09/113,088 | IJM29 |
| PO8046 | 09/112,771 | IJM30 |
| PO9390 | 09/112,769 | IJM31 |
| PO9392 | 09/112,770 | IJM32 |
| PP0889 | 09/112,798 | IJM35 |
| PP0887 | 09/112,801 | IJM36 |
| PP0882 | 09/112,800 | IJM37 |
| PP0874 | 09/112,799 | IJM38 |
| PP1396 | 09/113,098 | IJM39 |
| PP3989 | 09/112,833 | IJM40 |
| PP2591 | 09/112,832 | IJM41 |
| PP3990 | 09/112,831 | IJM42 |
| PP3986 | 09/112,830 | IJM43 |
| PP3984 | 09/112,836 | IJM44 |
| PP3982 | 09/112,835 | IJM45 |
| PP0895 | 09/113,102 | IR01 |
| PP0870 | 09/113,106 | IR02 |
| PP0869 | 09/113,105 | IR04 |
| PP0887 | 09/113,104 | IR05 |
| PP0885 | 09/112,810 | IR06 |
| PP0884 | 09/112,766 | IR10 |
| PP0886 | 09/113,085 | IR12 |
| PP0871 | 09/113,086 | IR13 |
| PP0876 | 09/113,094 | IR14 |
| PP0877 | 09/112,760 | IR16 |
| PP0878 | 09/112,773 | IR17 |
| PP0879 | 09/112,774 | IR18 |
| PP0883 | 09/112,775 | IR19 |
| PP0880 | 09/112,745 | IR20 |
| PP0881 | 09/113,092 | IR21 |
| PO8006 | 09/113,100, PN 6,087,638 | MEMS02 |
| PO8007 | 09/113,093 | MEMS03 |
| PO8008 | 09/113,062 | MEMS04 |
| PO8010 | 09/113,064, PN 6,041,600 | MEMS05 |
| PO8011 | 09/113,082 | MEMS06 |
| PO7947 | 09/113,081, PN 6,067,797 | MEMS07 |
| PO7944 | 09/113,080 | MEMS09 |
| PO7946 | 09/113,079, PN 6,044,646 | MEMS10 |
| PO9393 | 09/113,065 | MEMS11 |
| PP0875 | 09/113,078 | MEMS12 |
| PP0894 | 09/113,075 | MEMS13 |

STATEMENT REGARDING FEDERALLY SPONSORED RESEARCH OR DEVELOPMENT

Not applicable.

FIELD OF THE INVENTION

The present invention relates to the field of ink jet printing and in particular, discloses a method of manufacture of a paddle ink jet printer without an ink ejection nozzle.

BACKGROUND OF THE INVENTION

Many ink jet printing mechanisms are known. Unfortunately, in mass production techniques, the production of ink jet heads is quite difficult. For example, often, the orifice or nozzle plate is constructed separately from the ink supply and ink ejection mechanism and bonded to the mechanism at a later stage (Hewlett-Packard Journal, Vol. 36 no 5, pp33–37 (1985)). These separate material processing steps required in handling such precision devices often add a substantial expense in manufacturing.

Additionally, side shooting ink jet technologies (U.S. Pat. No. 4,899,181) are often used but again, this limits the amount of mass production throughput given any particular capital investment.

Additionally, more esoteric techniques are also often utilised. These can include electro forming of nickel stage (Hewlett-Packard Journal, Vol. 36 no 5, pp33–37 (1985)), electro-discharge machining, laser ablation (U.S. Pat. No. 5,208,604), micro-punching, etc.

The utilisation of the above techniques is likely to add substantial expense to the mass production of ink jet print heads and therefore add substantially to their final cost.

It would therefore be desirable if an efficient system for the mass production of ink jet print heads could be developed.

SUMMARY OF THE INVENTION

It is an object of the present invention to provide for an ink jet printer having an ink ejection arrangement which includes a paddle ejection mechanism without a nozzle.

In accordance with a first aspect of the present invention, there is provided a method of manufacture of an ink jet printer which includes a trough having side walls and an exposed roof, the trough being substantially filled with fluid during operation; a paddle vane located within the trough and offset from one wall when the paddle vane is in a quiescent position; an actuation mechanism attached to the paddle vane such that, upon activation of the actuation mechanism, the paddle vane is caused to move towards the one wall, resulting in an increase in pressure in the fluid between the one wall and the paddle vane, resulting in a consequential ejection of fluid via the exposed roof, the method comprising the steps of (a) initially providing a silicon wafer having a circuitry wafer layer including the electrical circuitry necessary for the operation of the thermal actuators on demand; (b) etching the trough in the surface of the wafer; (c) creating the actuation mechanism and the paddle vane on the silicon wafer by means of depositing and etching a series of sacrificial layers to form a supporting structure for the actuation mechanism and the paddle vane, in addition to depositing and suitably etching a series of materials for forming the actuation mechanism and the paddle vane; (d) etching an ink supply channel interconnecting the trough through the wafer with an ink supply reservoir; and (e) etching away any remaining sacrificial layers so as to release the actuation mechanism and the panel vane for operation. Preferably, the step (c) comprises the steps of:

(i) depositing and etching a first series of sacrificial layers to form a first supporting structure;

(ii) depositing and etching a conductive material to form a first conductive portion of the actuation mechanism and the paddle vane;

(iii) depositing and etching a second series of sacrificial layers to form a second supporting structure for a non-conductive portion of the actuation mechanism;

(iv) depositing and etching a non-conductive material to form those non-conductive portions of the actuation mechanism;

(v) depositing and etching a third series of sacrificial layers to form a third supporting structure for the actuation mechanism; and (vi) depositing and etching a second conductive material to form a second conductive portion of the actuation mechanism and the paddle vane.

BRIEF DESCRIPTION OF THE DRAWINGS

Notwithstanding any other forms which may fall within the scope of the present invention, preferred forms of the invention will now be described, by way of example only, with reference to the accompanying drawings in which:

FIGS. 5–24 illustrate the various manufacturing steps in the construction of the preferred embodiment;

DESCRIPTION OF PREFERRED AND OTHER EMBODIMENTS

In the preferred embodiment, there is provided an inkjet printing arrangement arranged on a silicon wafer. The ink is supplied to a first surface of the silicon wafer by means of channels etched through the back of the wafer to an ink ejection chamber located along the surface of the wafer. The ink ejection chamber is filled with ink and includes a paddle vane attached to an external actuator which is activated so as to compress a portion of the ink within the chamber against a sidewall resulting in the corresponding ejection of the ink from the chamber.

Figure 1:
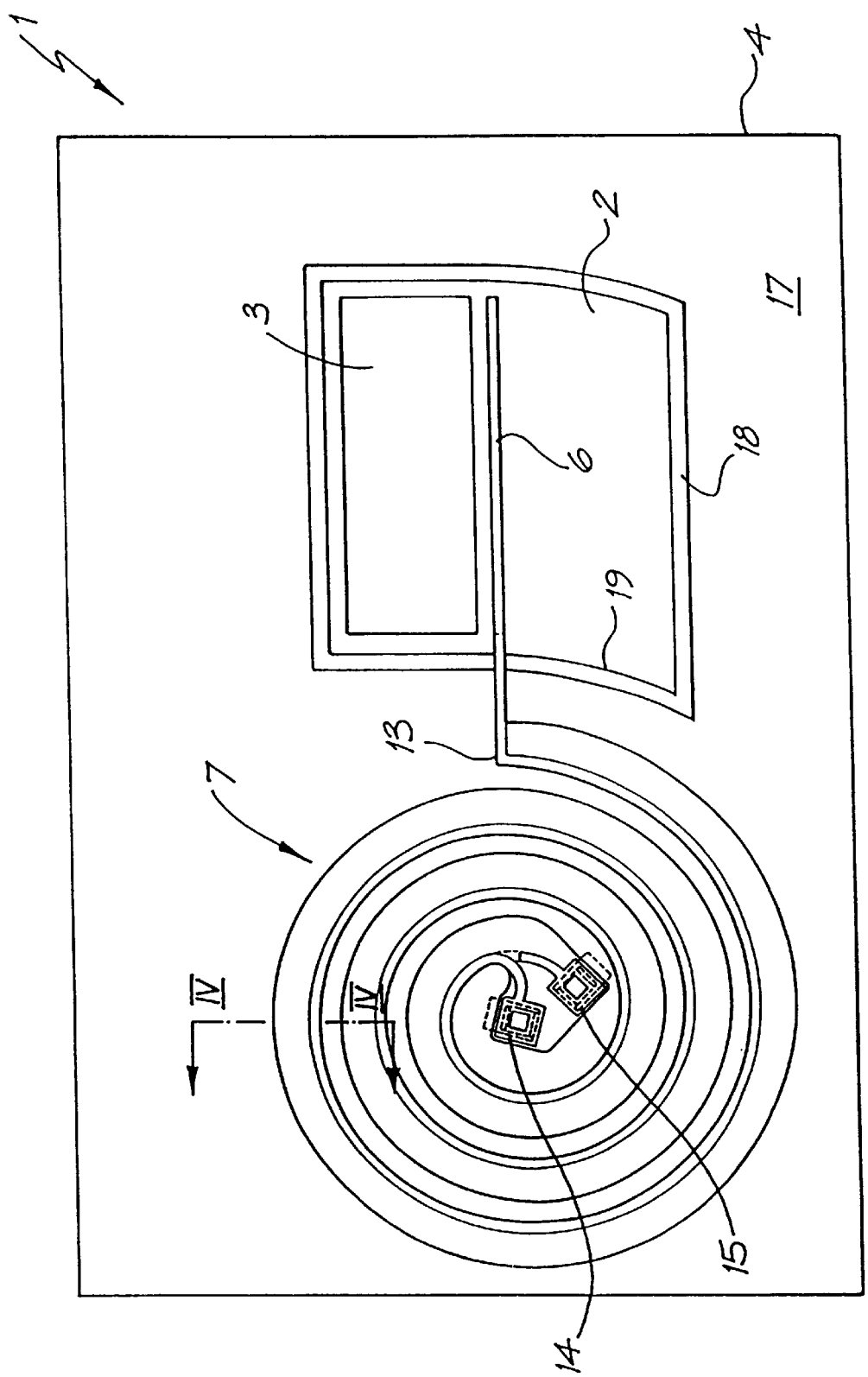
FIG. 1 is a descriptive view of an ink ejection arrangement when in a quiescent state.
Figure 2:
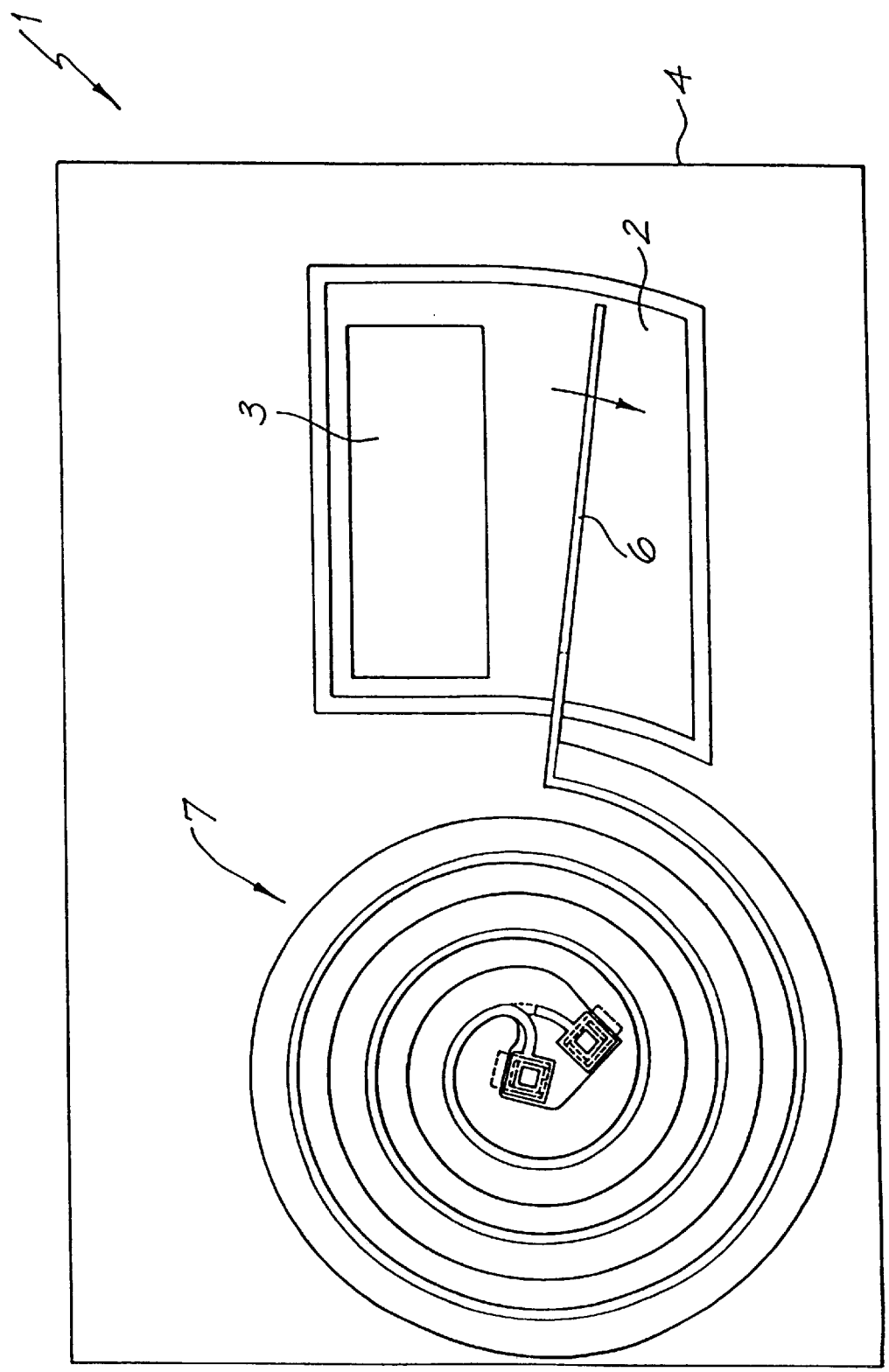
FIG. 2 is a descriptive view of an ejection arrangement when in an activated state.
Figure 3:
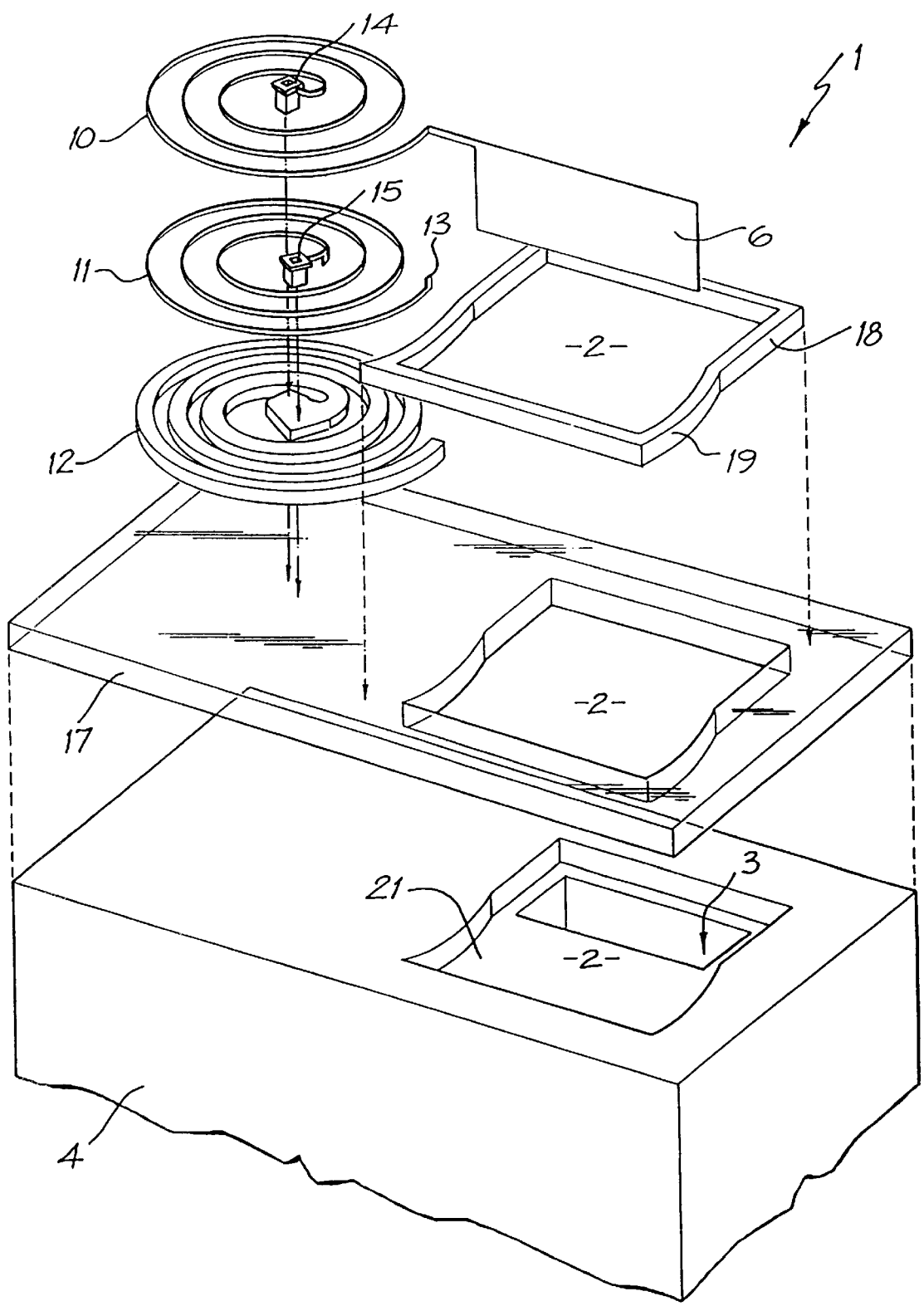
FIG. 3 is an exploded perspective view of the different components of an ink ejection arrangement.

Turning now to the figures, FIG. 1 illustrates the ink ejection arrangement 1 in the quiescent position with FIG. 2 illustrating the preferred arrangement 1 after activation of the thermal actuator 7 and FIG. 3 illustrates an exploded perspective of the ink ejection arrangement 1.

Turning initially to FIG. 1, as noted previously, ink is supplied to an ink ejection chamber 2 from an ink supply channel 3 which is etched through the wafer 4 and supplies ink to the ejection chamber 2. Located between the supply channel 3 and the ejection chamber 2 is a paddle 6 which is3 attached to an actuator device 7, which can comprise a thermal actuator. When the actuator 7 is actuated, the paddle 6 is caused to move as illustrated in FIG. 2 thereby compressing ink within the ink ejection chamber 2 resulting in its corresponding ejection from the chamber 2. The actuator 7 comprises a coiled arm which is in turn made up of three sub-arm components.

Figure 4:
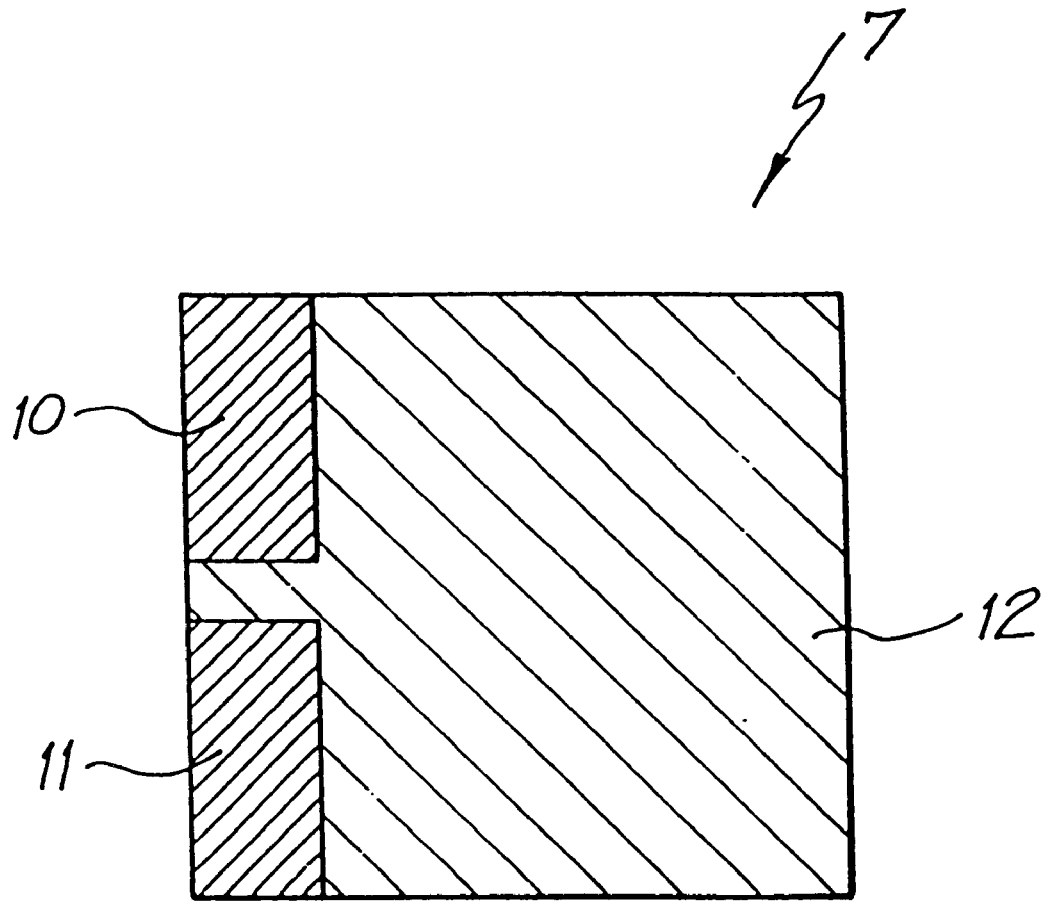
FIG. 4 illustrates a cross section through the line IV—IV of FIG. 1.

Turning to FIG. 4, there is illustrated a section through the line IV—IV of FIG. 1 illustrating the structure of the arm which includes an upper conductive arm 10 and a lower conductive arm 11.

The two arms can be made from conductive titanium diboride which has a high Young's modulus in addition to a suitably high coefficient of thermal expansion. The two arms 10, 11 are encased in a silicon nitride portion of the arm 12. The two arms 10, 11 are conductively interconnected at one end 13 (FIG. 1) of the actuator 7 and, at the other end they are electrically interconnected at 14, 15 to control circuitry of a lower CMOS layer 17 which includes the drive circuitry for activating the actuator 7.

The conductive heating of the arms 10, 11 results in a general expansion of these two arms 10, 11. The expansion works against the nitride portion 12 of the arm resulting in an "uncoiling" of the actuator 7 which in turn results in corresponding movement of the paddle 6 resulting in the ejection of ink from the nozzle chamber 2. The nozzle chamber 2 can include a rim 18 which, for convenience, can also be constructed from titanium diboride. The rim includes an arc profile eg. 19 which is designed to follow the path swept out by paddle 6 as it is displaced as a result of actuation of the actuator 7. The walls of ink ejection chamber 2 are similarly profiled. Upon ejection of a drop, the paddle 6 returns to its quiescent position.

Turning now to FIGS. 5–24, there will be explained the manufacturing processing steps involved in the construction of the preferred embodiment.

1. Starting initially with FIG. 5, the starting arrangement of the preferred embodiment is a silicon wafer 4 having a CMOS layer 17 which can comprise the normal CMOS multi-level metal layers etc. and which provide the electrical circuitry for the operation of the preferred embodiment which can be formed as part of a multiple series or array of printer devices at a time on a single wafer.

2. The next step in the construction of the preferred embodiment is to form an etched pit 21 as illustrated in FIG. 6. The etched pit 21 can be formed utilising a highly anisotropic trench etcher such as that available from Silicon Technology Systems of the United Kingdom. The pit 21 is preferably etched to have steep sidewalls. A dry etch system capable of high aspect ratio deep silicon trench etching is that known as the Advance Silicon Etch System available from Surface Technology Systems of the United Kingdom.

Figure 7:
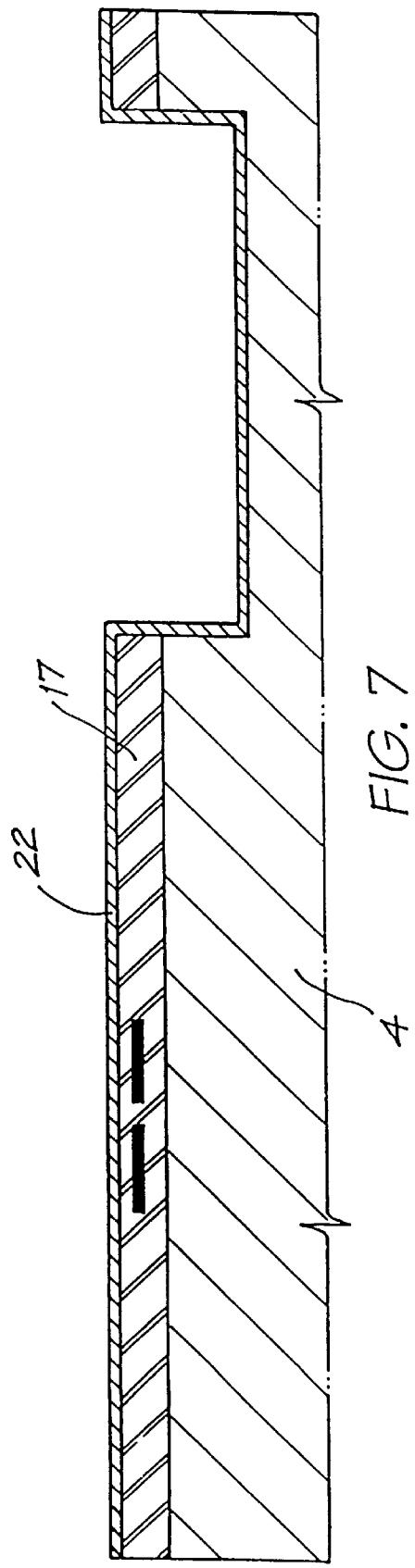

3. Next, as is illustrated in FIG. 7, a 1 $\mu$m layer 22 of aluminum is deposited over the surface of the wafer 4.

Figure 8:
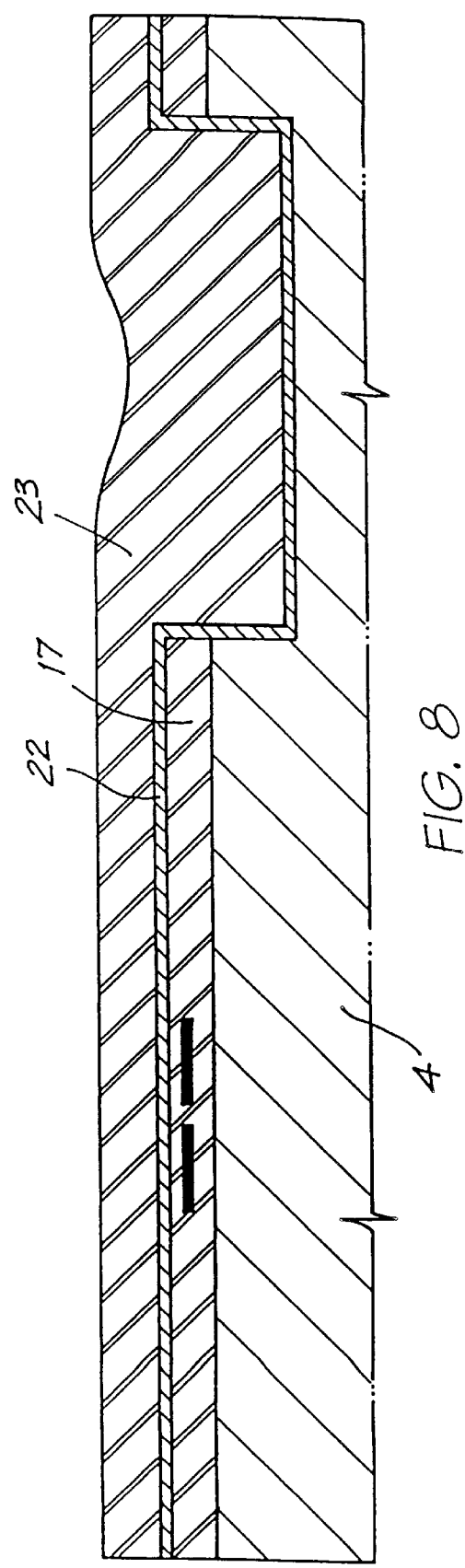

4. Next, as illustrated in FIG. 8 a five micron glass layer 23 is then deposited on top of the aluminum layer 22.

Figure 9:
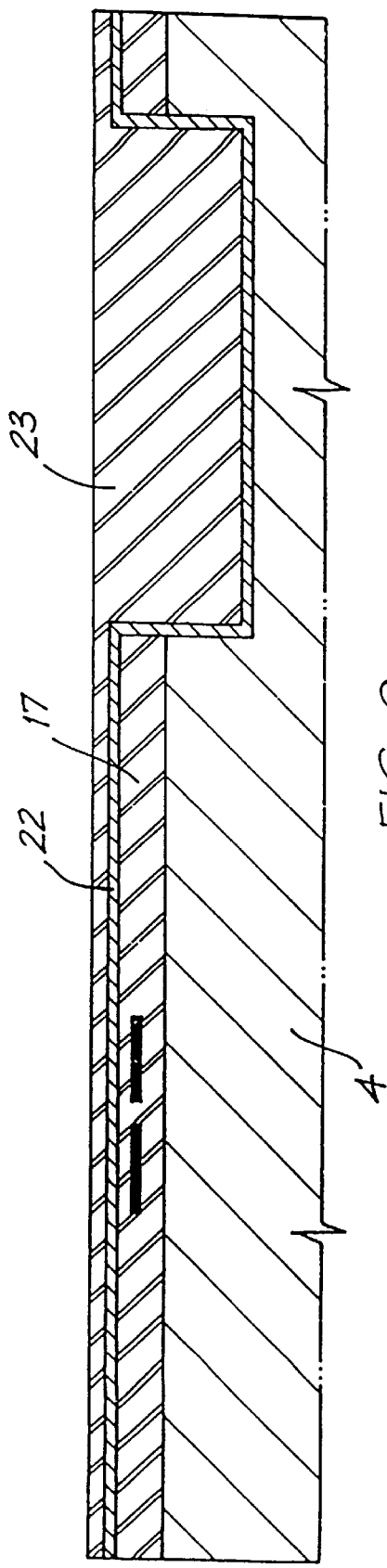

5. Next, the glass layer 23 is chemically mechanically planarised so as to provide a 1 $\mu$m thick layer of glass over the aluminum layer 22 as illustrated in FIG. 9.

Figure 10:
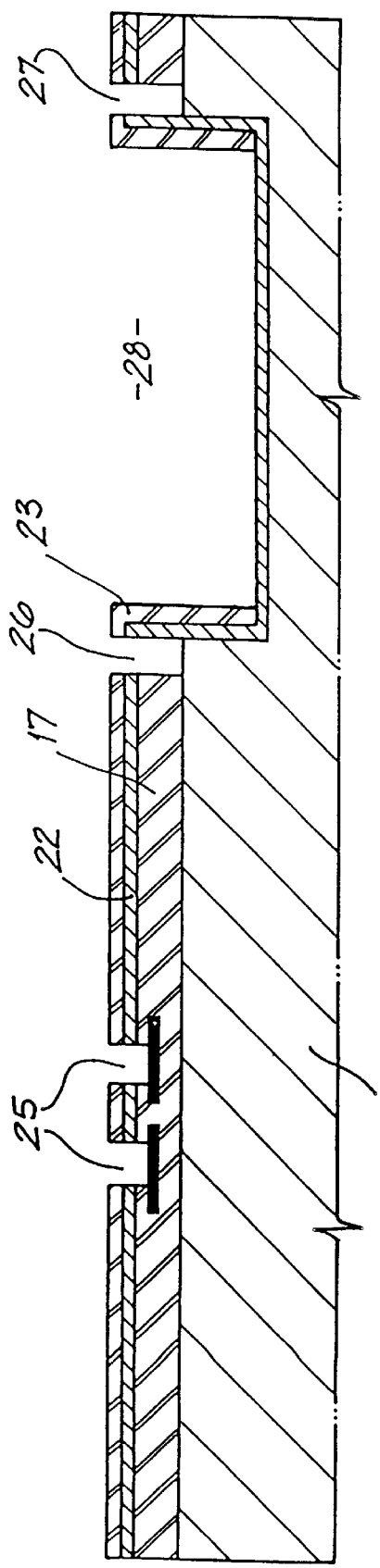

6. Next, a triple masked etch process is utilised to etch the deposited layers as illustrated in FIG. 10. The etch includes a 1.5 $\mu$m etch of the glass layer 23. The etch provides for the etching of via 25, trenches 26, 27 for rim portions and a trench 28 for a paddle portion.

7. Next, as illustrated in FIG. 11, a 0.9 $\mu$m layer 60 of titanium diboride is deposited.

8. The titanium diboride layer 60 is subsequently masked and etched so as to leave those portions as illustrated in FIG. 12.

9. Subsequently, a 1 $\mu$m layer 61 of silicon dioxide ($SiO_2$) is deposited and chemical-mechanically planarised as illustrated in FIG. 13 to the level of the titanium diboride.

10. Next, as illustrated in FIG. 14 the silicon dioxide layer 61 is etched to form the spiral pattern where a nitride layer will later be deposited. The spiral pattern includes etched portions 30–32.

11. Next, as illustrated in FIG. 15, a 0.2 $\mu$m layer 62 of the silicon nitride is deposited.

12. The silicon nitride layer 62 is then etched in areas 34–36 so as to provide for electrical interconnect in areas 34, 35, in addition to a mechanical interconnect, as will become more apparent hereinafter, in the area 36.

Figure 17:
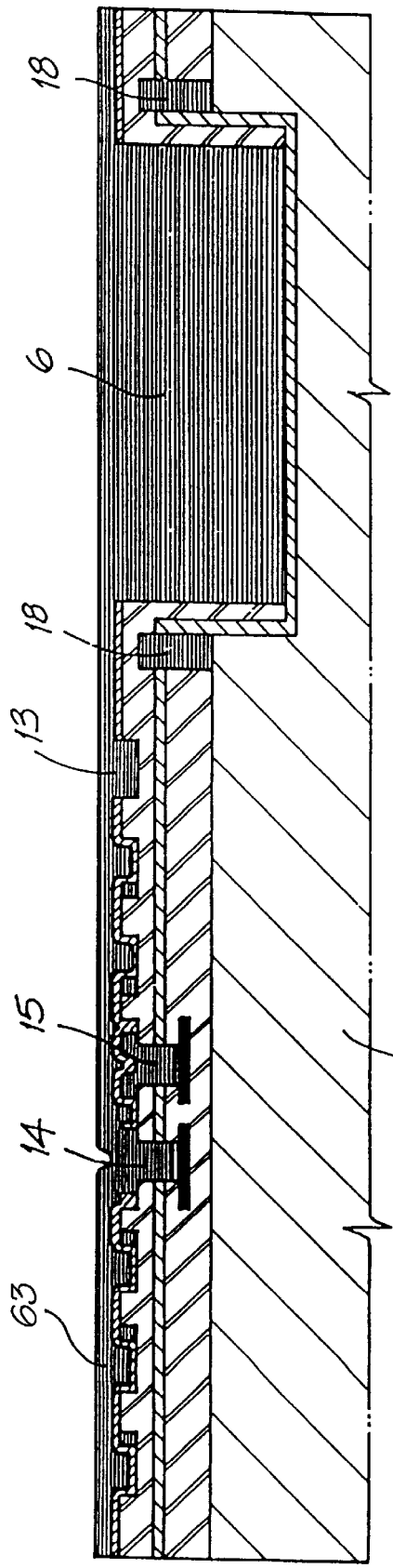

13. Turning next to FIG. 17, a 0.9 $\mu$m layer 63 of titanium diboride is then deposited.

Figure 18:
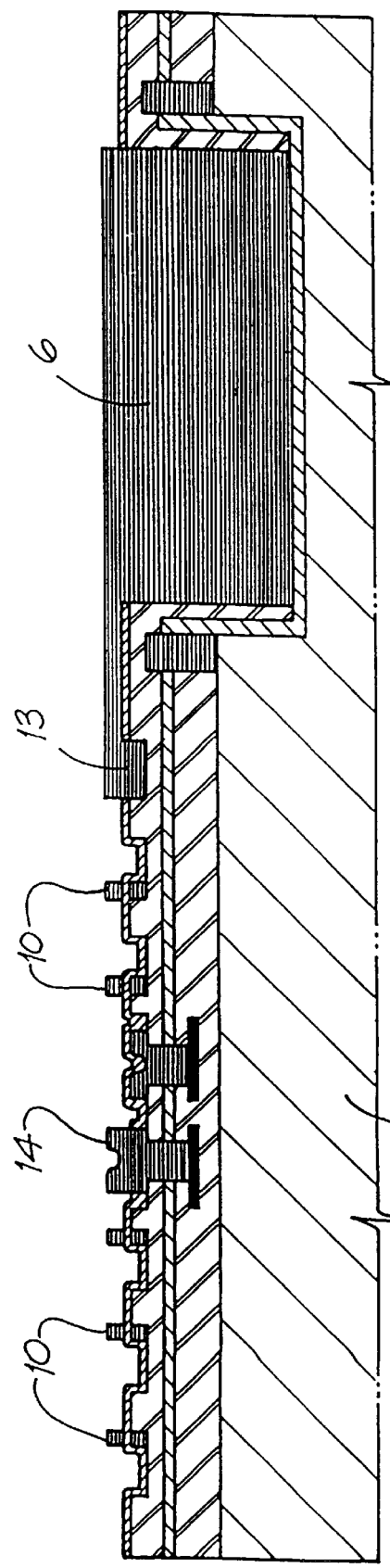

14. The titanium diboride is then etched so as to leave the via structure 14 the spiral structure eg. 10 and the paddle arm 6, as shown in FIG. 18.

15. Next, a 1 μm layer 64 of silicon nitride is then deposited as illustrated in FIG. 19.

16. The nitride layer 64 is then chemically and mechanically planarized to the level of the titanium diboride layer 63 as shown in FIG. 20.

17. Next, the silicon nitride layer 64 is etched so as to form the silicon nitride portions of the spiral arm 42, 43 with a thin portion of silicon nitride also remaining under the paddle arm as shown in FIG. 21.

18. Next, as illustrated in FIG. 22 an ink supply channel 3 can be etched from the back of the wafer 4. Again, an STS deep silicon trench etcher can be utilised.

Figure 23:
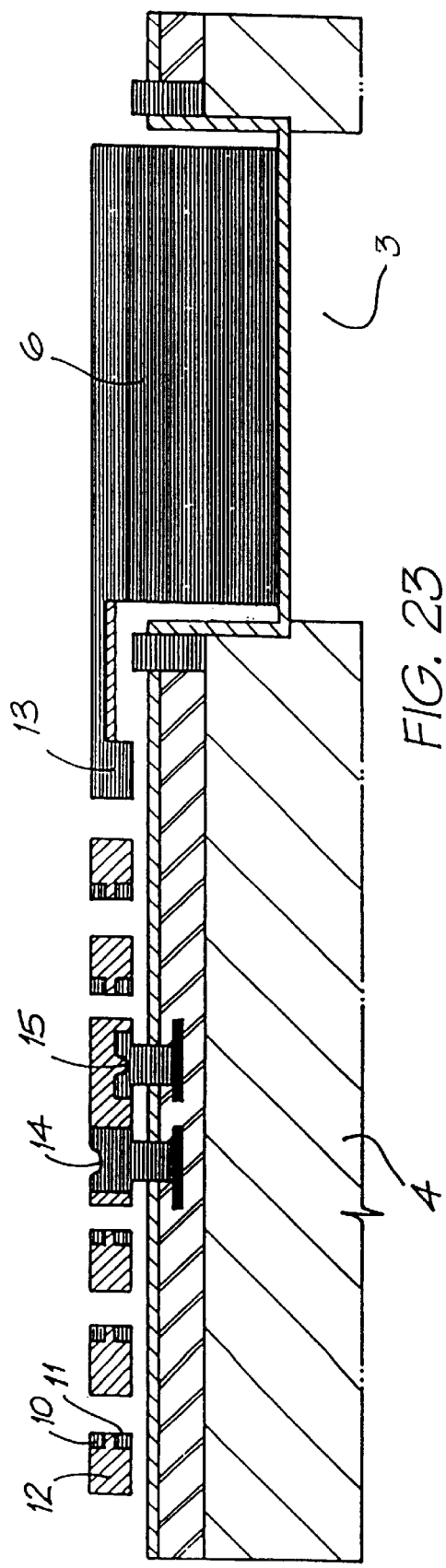

19. Turning now to FIG. 23, the next step is a wet etch of all exposed glass (SiO$_2$) surfaces of the wafer 4 which results in a substantial release of the paddle structure as illustrated in FIG. 23.

Figure 24:
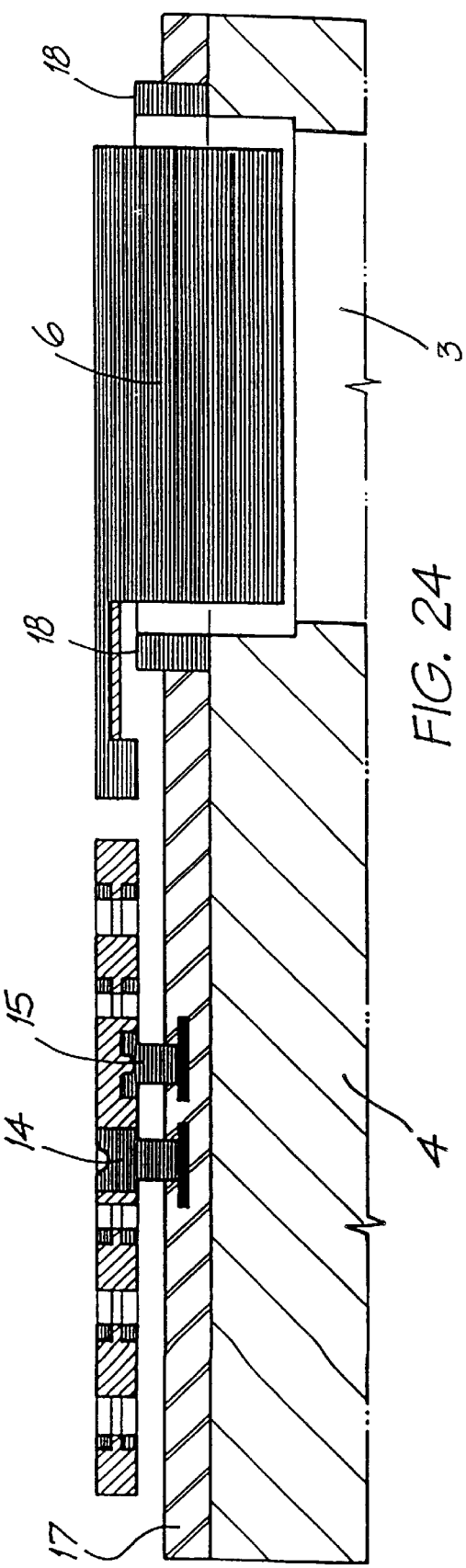

20. Finally, as illustrated in FIG. 24 the exposed aluminum surfaces are then wet etched away resulting in a release of the paddle structure which springs back to its quiescent or return position ready for operation.

The wafer can then be separated into printhead units and interconnected to an ink supply along the back surface of the wafer for the supply of ink to the ink ejection arrangement.

Figure 25:
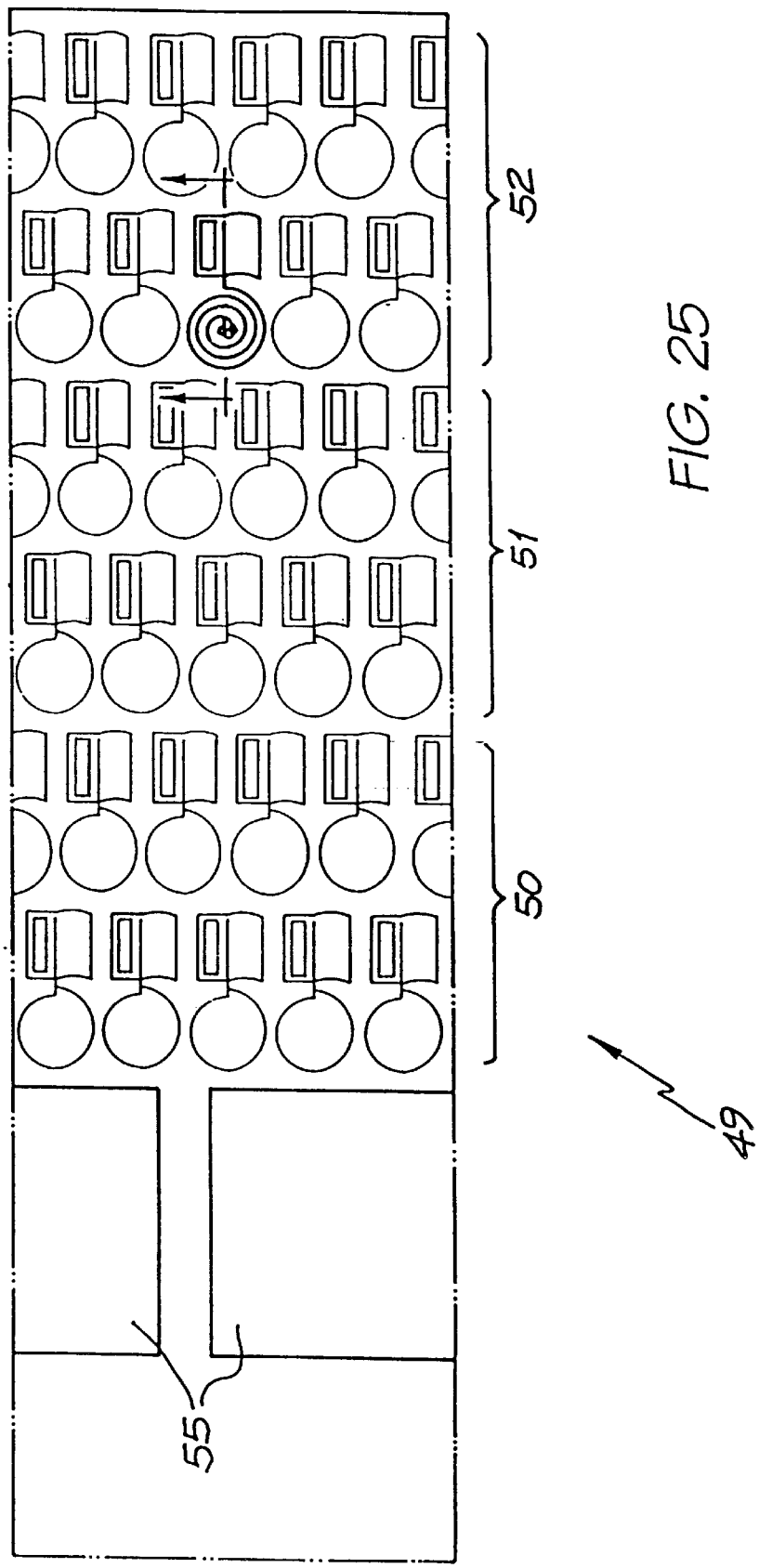
FIG. 25 illustrates a portion of an array of ink ejection arrangements as constructed in accordance with the preferred embodiment.

In FIG. 25, there is illustrated a portion 49 of an array of ink ejection arrangements which can include a three color output including a first color series 50, a second color series 51 and a third color series 52. Each color series is further divided into two rows of ink ejection units with each unit providing for the ink ejection of drops corresponding to a single pixel of a line. Hence, a page width array of nozzles can be formed including appropriate bond pads eg. 55 for providing for an electrical interconnect. The page width printhead can be formed by silicon wafer with multiple print heads being formed simultaneously utilising the aforementioned steps. Subsequently, the print heads can be separated and joined on an ink supply mechanism for supplying ink via the back of the wafer to each ink ejection arrangement, the supply being suitably arranged for providing the separate colors.

The presently disclosed ink jet printing technology is potentially suited to a wide range of printing systems including: color and monochrome office printers, short run digital printers, high speed digital printers, offset press supplemental printers, low cost scanning printers high speed pagewidth printers, notebook computers with in-built pagewidth printers, portable color and monochrome printers, color and monochrome copiers, color and monochrome facsimile machines, combined printer, facsimile and copying machines, label printers, large format plotters, photograph copiers, printers for digital photographic "minilabs", video printers, PHOTO CD (PHOTO CD is a registered trade mark of the Eastman Kodak Company) printers, portable printers for PDAs, wallpaper printers, indoor sign printers, billboard printers, fabric printers, camera printers and fault tolerant commercial printer arrays.

Figure 26:
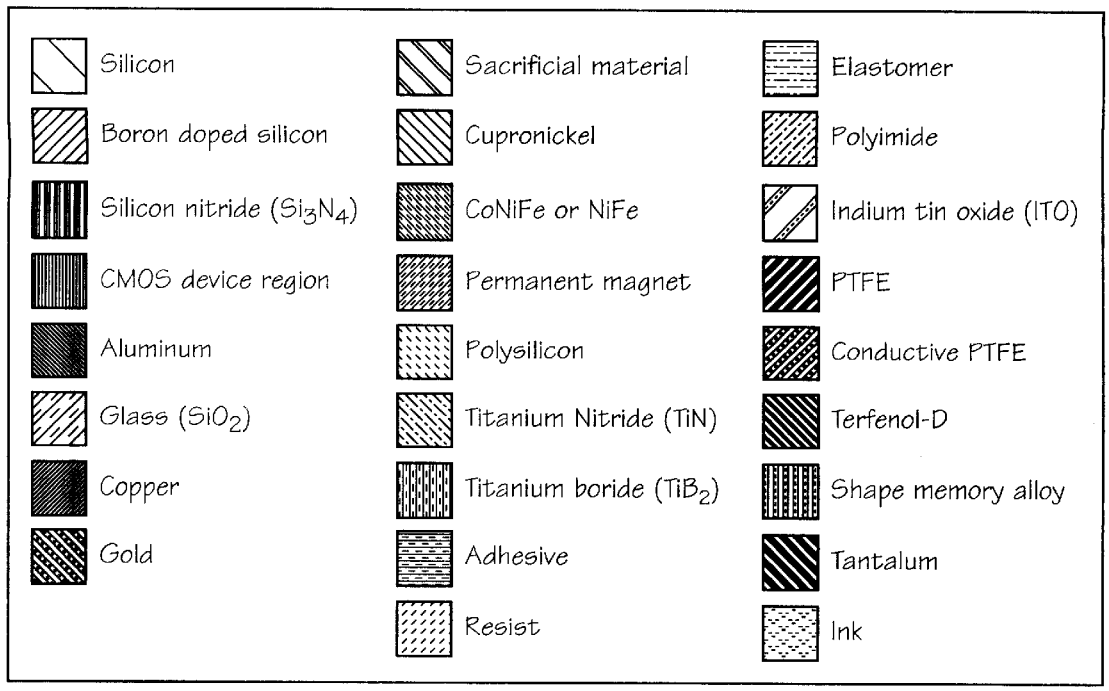
FIG. 26 provides a legend of the materials indicated in FIGS. 27 to 38.
Figure 27:
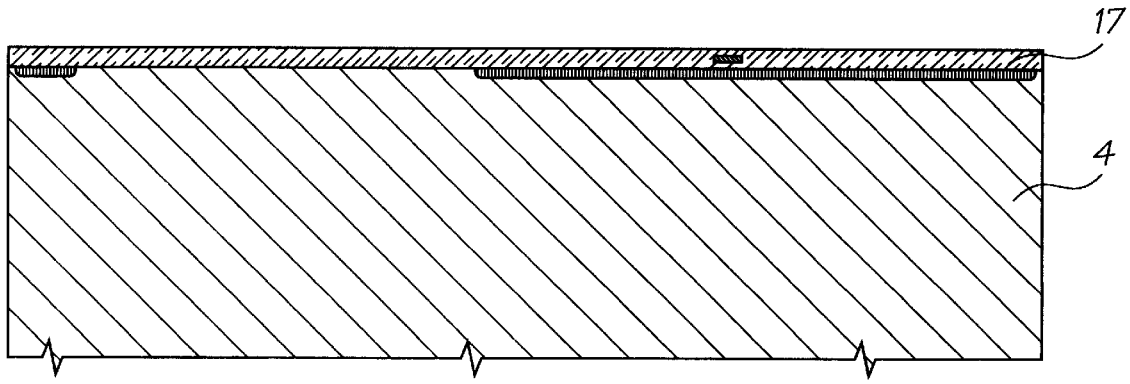
FIG. 27 to FIG. 38 illustrate sectional views of the manufacturing steps in one form of construction of an ink jet printhead nozzle.

One form of detailed manufacturing process which can be used to fabricate monolithic ink jet print heads operating in accordance with the principles taught by the present embodiment can proceed utilizing the following steps:

1. Using a double sided polished wafer 4, complete drive transistors, data distribution, and timing circuits using a 0.5 micron, one poly, 2 metal CMOS process layer 17. Relevant features of the wafer 4 at this step are shown in FIG. 27. For clarity, these diagrams may not be to scale, and may not represent a cross section though any single plane of the nozzle. FIG. 26 is a key to representations of various materials in these manufacturing diagrams, and those of other cross referenced ink jet configurations.

Figure 28:
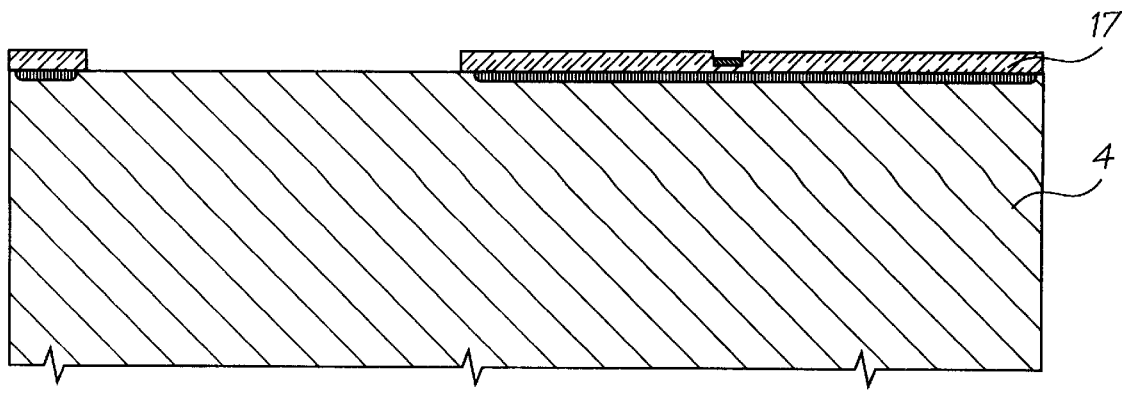

2. Etch oxide down to silicon or aluminum using Mask 1. This mask defines the ink inlet, the heater contact vias, and the edges of the print head chips. This step is shown in FIG. 28.

Figure 29:
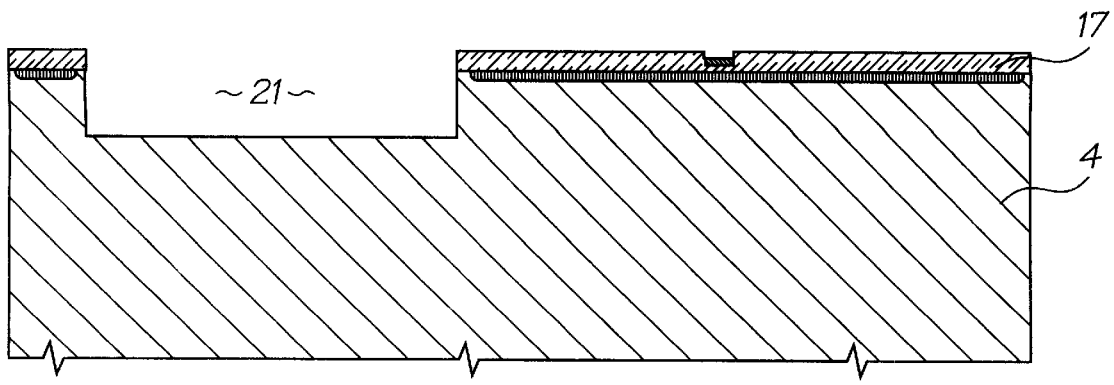

3. Etch silicon 4 to a depth of 10 microns using the etched oxide as a mask. This step is shown in FIG. 29.

Figure 30:
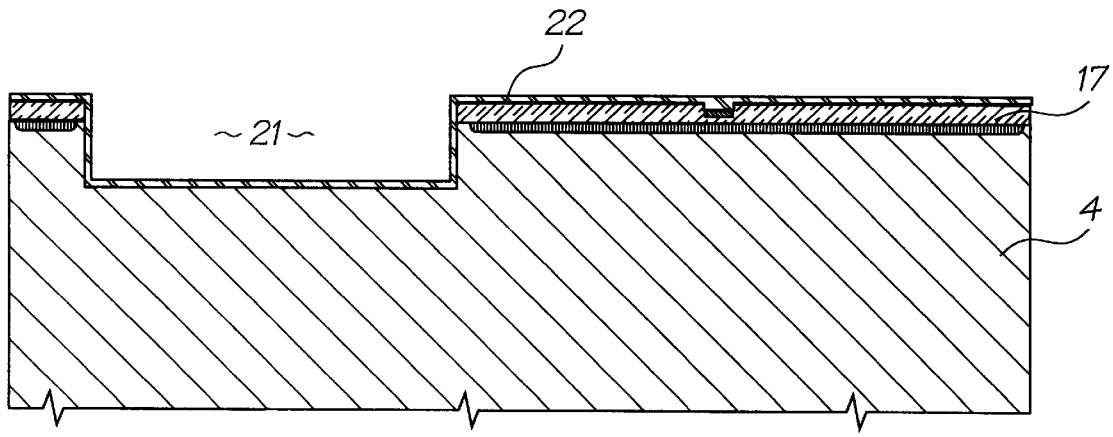

4. Deposit 1 micron of sacrificial material 22 (e.g. aluminum). This step is shown in FIG. 30.

5. Deposit 10 microns of a second sacrificial material 70 (e.g. polyimide). This fills the etched silicon hole.

Figure 31:
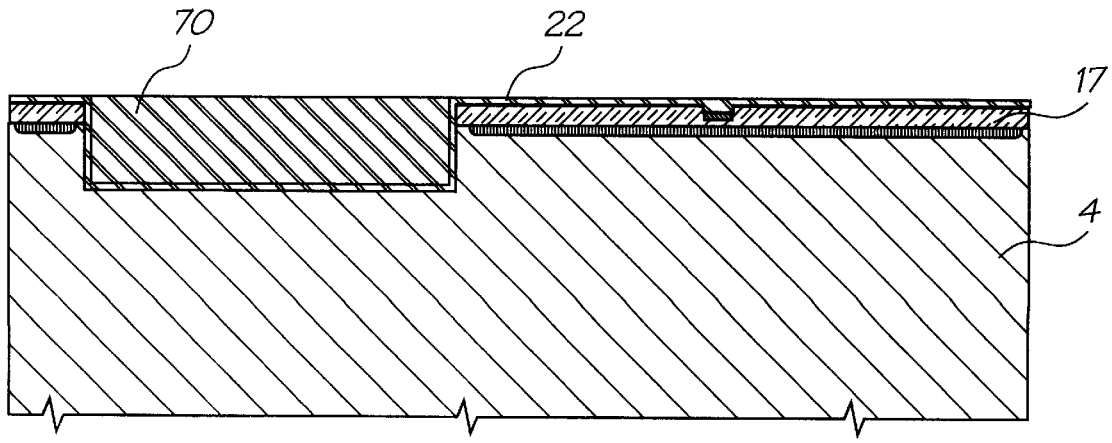

6. Planarize using CMP to the level of the first sacrificial material 22. This step is shown in FIG. 31.

Figure 32:
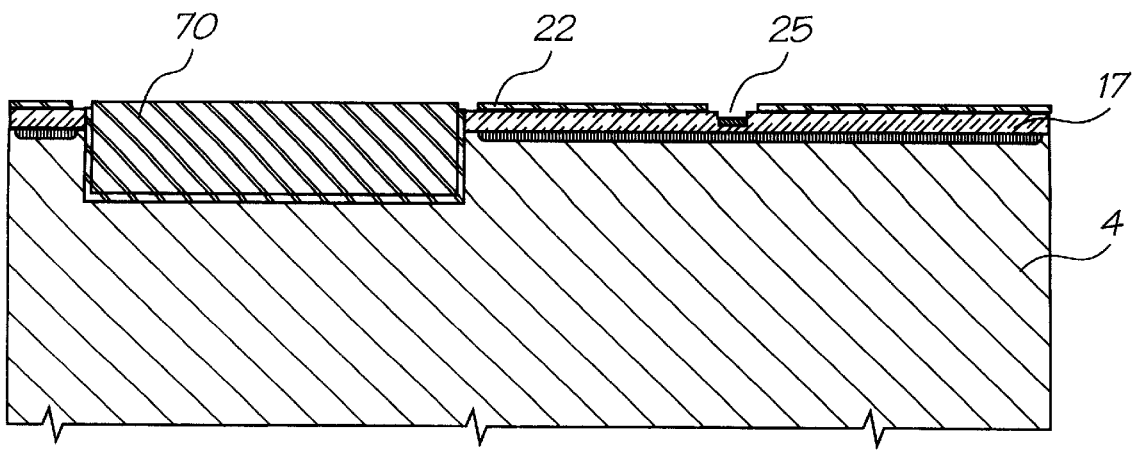

7. Etch the first sacrificial layer 22 using Mask 2, defining the nozzle chamber wall and the actuator anchor point 25. This step is shown in FIG. 32.

8. Deposit 1 micron of glass 71.

9. Etch the glass 71 and second sacrificial layer 70 using Mask 3. This mask defines the lower layer of the actuator loop, the nozzle chamber wall, and the lower section of the paddle.

Figure 33:
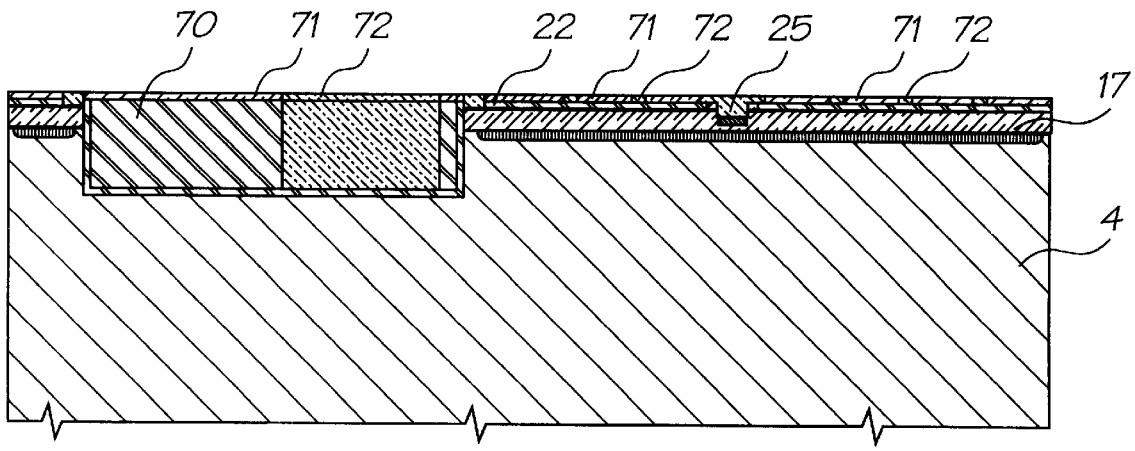

10. Deposit 1 micron of heater material 72, for example titanium nitride (TiN) or titanium diboride (TiB2). Planarize using CMP. Steps 8 to 10 form a 'damascene' process. This step is shown in FIG. 33.

11. Deposit 0.1 micron of silicon nitride 73.

12. Deposit 1 micron of glass 74.

13. Etch the glass 74 using Mask 4, which defines the upper layer of the actuator loop, the arm to the paddle, and the upper section of the paddle.

14. Etch the silicon nitride 73 using Mask 5, which defines the vias connecting the upper layer of the actuator loop to the lower layer of the actuator loop, as well as the arm to the paddle, and the upper section of the paddle.

Figure 34:
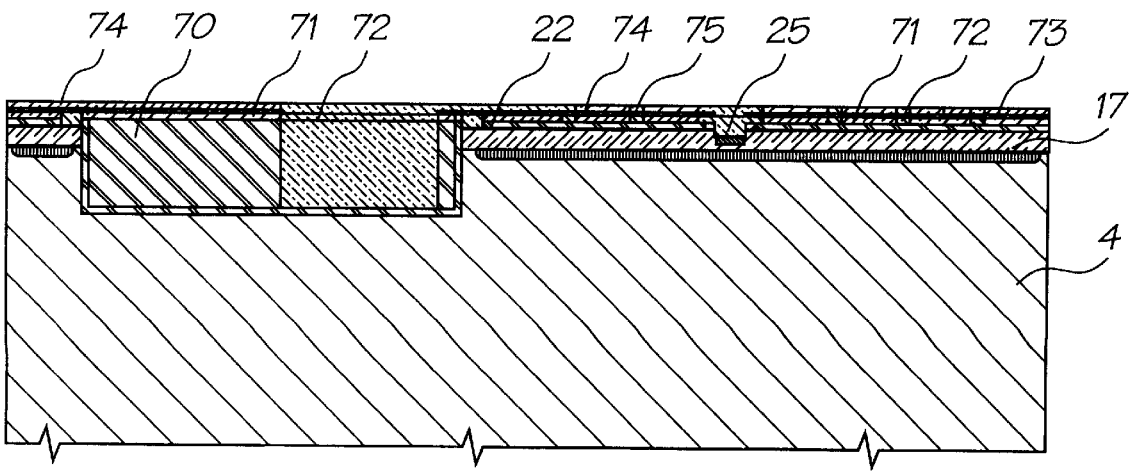

15. Deposit 1 micron of the same heater material 75 as in step 10. Planarize using CMP. Steps 11 to 15 form a 'dual damascene' process. This step is shown in FIG. 34.

Figure 35:
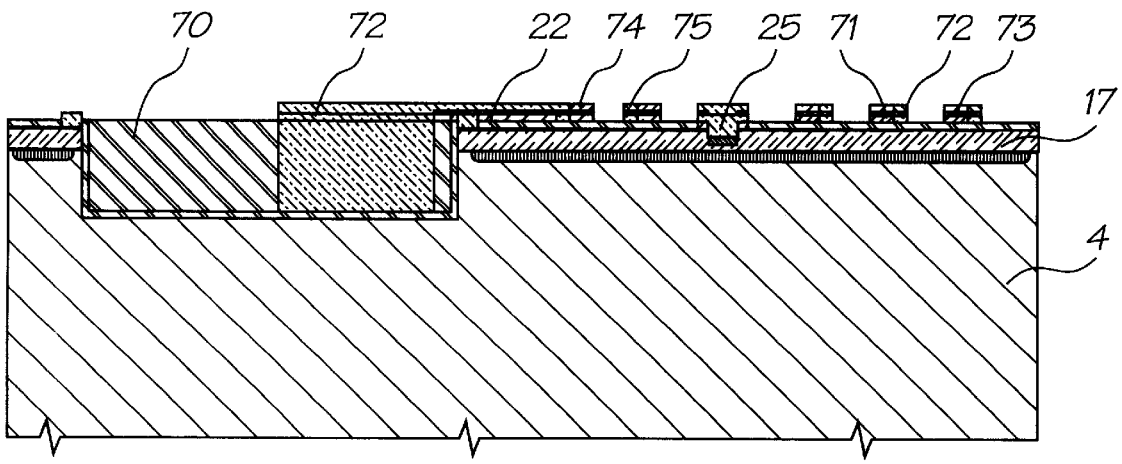

16. Etch the glass and nitride down to the sacrificial layer 22 using Mask 6, which defines the actuator. This step is shown in FIG. 35.

17. Wafer probe. All electrical connections are complete at this point, bond pads are accessible, and the chips are not yet separated.

Figure 36:
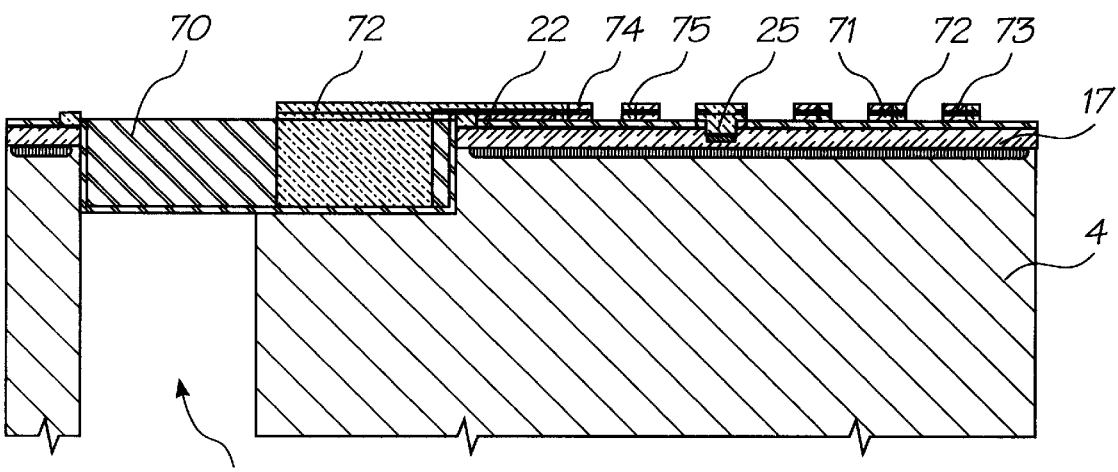

18. Back-etch completely through the silicon wafer (with, for example, an ASE Advanced Silicon Etcher from Surface Technology Systems) using Mask 7. This mask defines the ink inlets 3 which are etched through the wafer 4. The wafer 4 is also diced by this etch. This step is shown in FIG. 36.

Figure 37:
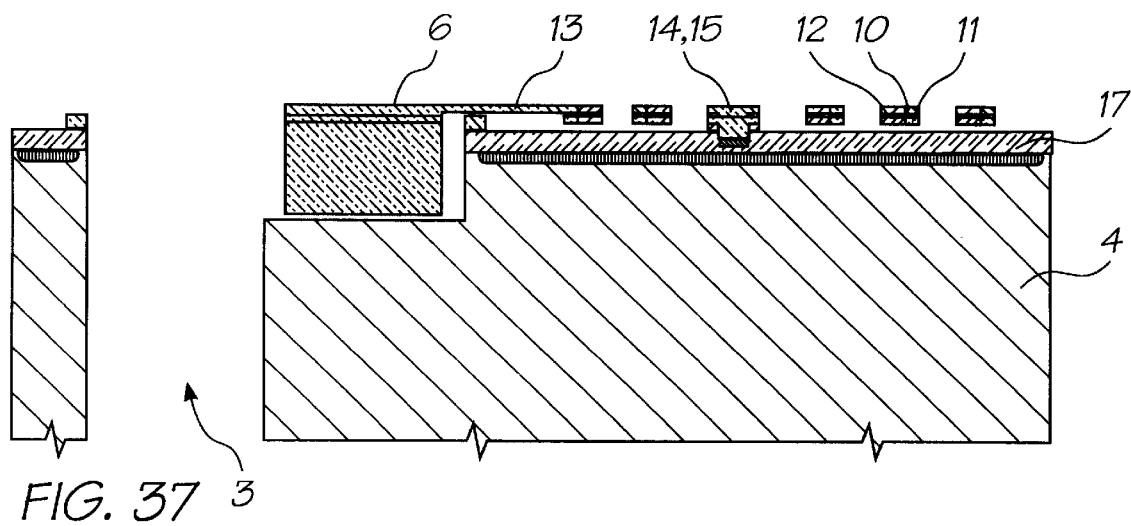

19. Etch both sacrificial materials 22, 70. The nozzle chambers are cleared, the actuators freed, and the chips are separated by this etch. This step is shown in FIG. 37.

20. Mount the print heads in their packaging, which may be a molded plastic former incorporating ink channels which supply the appropriate color ink to the ink inlets 3 at the back of the wafer.

21. Connect the print heads to their interconnect systems. For a low profile connection with minimum disruption of airflow, TAB may be used. Wire bonding may also be used if the printer is to be operated with sufficient clearance to the paper.

22. Fill the print head with water. Hydrophobize the exposed portions or the print head by exposing the print head to a vapor of a perfluorinated alkyl trichlorosilane. Drain the water and dry the print head.

Figure 38:
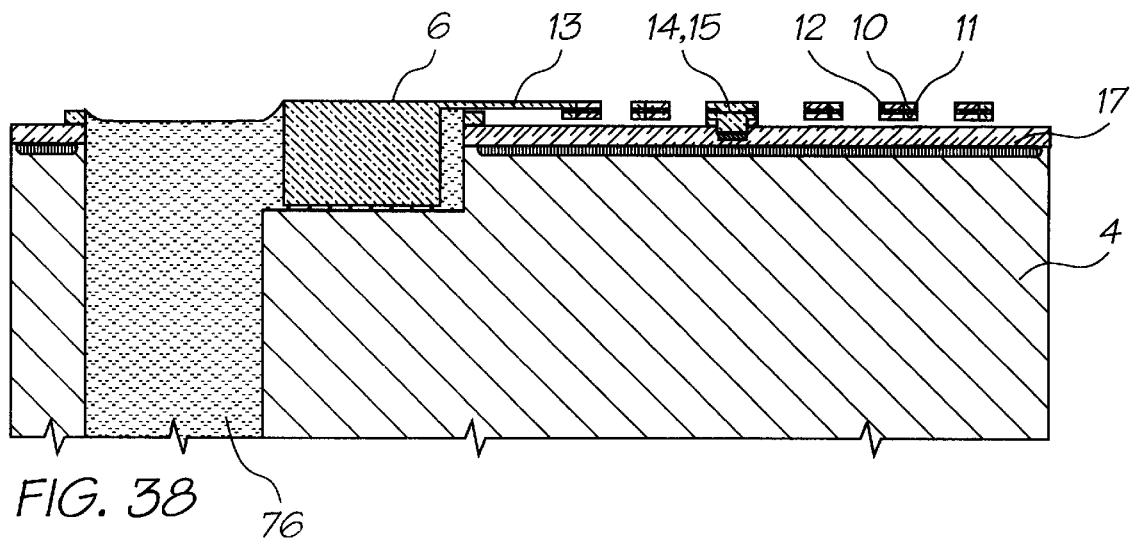

23. Fill the completed print heads with ink 76 and test them. A filled nozzle is shown in FIG. 38.

It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

Ink Jet Technologies

The embodiments of the invention use an ink jet printer type device. Of course many different devices could be used. However presently popular ink jet printing technologies are unlikely to be suitable.

The most significant problem with thermal ink jet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal ink jet applications. This leads to an efficiency of around 0.02%, from electricity input to drop momentum (and increased surface area) out.

The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per print head, but is a major impediment to the fabrication of pagewidth print heads with 19,200 nozzles.

Ideally, the ink jet technologies used meet the stringent requirements of in-camera digital color printing and other high quality, high speed, low cost printing applications. To meet the requirements of digital photography, new ink jet technologies have been created. The target features include:

low power (less than 10 Watts)

high resolution capability (1,600 dpi or more)

photographic quality output low manufacturing cost small size (pagewidth times minimum cross section)

high speed (<2 seconds per page).

All of these features can be met or exceeded by the ink jet systems described below with differing levels of difficulty. Forty-five different ink jet technologies have been developed by the Assignee to give a wide range of choices for high volume manufacture. These technologies form part of separate applications assigned to the present Assignee as set out in the table above under the heading Cross References to Related Applications.

The ink jet designs shown here are suitable for a wide range of digital printing systems, from battery powered one-time use digital cameras, through to desktop and network printers, and through to commercial printing systems For ease of manufacture using standard process equipment, the print head is designed to be a monolithic 0.5 micron CMOS chip with MEMS post processing. For color photographic applications, the print head is 100 mm long, with a width which depends upon the ink jet type. The smallest print head designed is IJ38, which is 0.35 mm wide, giving a chip area of 35 square mm. The print heads each contain 19,200 nozzles plus data and control circuitry.

Ink is supplied to the back of the print head by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The print head is connected to the camera circuitry by tape automated bonding.

Tables of Drop-on-Demand Ink Jets

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of ink jet types.

Actuator mechanism (18 types)

Basic operation mode (7 types)

Auxiliary mechanism (8 types)

Actuator amplification or modification method (17 types)

Actuator motion (19 types)

Nozzle refill method (4 types)

Method of restricting back-flow through inlet (10 types)

Nozzle clearing method (9 types)

Nozzle plate construction (9 types)

Drop ejection direction (5 types)

Ink type (7 types)

The complete eleven dimensional table represented by these axes contains 36.9 billion possible configurations of ink jet nozzle. While not all of the possible combinations result in a viable ink jet technology, many million configurations are viable. It is clearly impractical to elucidate all of the possible configurations. Instead, certain ink jet types have been investigated in detail. These are designated IJ01 to IJ45 which matches the docket numbers in the table under the heading Cross References to Related Applications Other ink jet configurations can readily be derived from these forty-five examples by substituting alternative configurations along one or more of the 11 axes. Most of the IJ01 to IJ45 examples can be made into ink jet print heads with characteristics superior to any currently available ink jet technology.

Where there are prior art examples known to the inventor, one or more of these examples are listed in the examples column of the tables below. The IJ01 to IJ45 series are also listed in the examples column. In some cases, a printer may be listed more than once in a table, where it shares characteristics with more than one entry.

Suitable applications for the ink jet technologies include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

| | Description | Advantages | Disadvantages | Examples |
|---|---|---|---|---|
| ACTUATOR MECHANISM (APPLIED ONLY TO SELECTED INK DROPS) | | | | |
| Thermal bubble | An electrothermal heater heats the ink to above boiling point, transferring significant heat to the aqueous ink. A bubble nucleates and quickly forms, expelling the ink. The efficiency of the process is low, with typically less than 0.05% of the electrical energy being transformed into kinetic energy of the drop. | ♦ Large force generated<br>♦ Simple construction<br>♦ No moving parts<br>♦ Fast operation<br>♦ Small chip area required for actuator | ♦ High power<br>♦ Ink carrier limited to water<br>♦ Low efficiency<br>♦ High temperatures required<br>♦ High mechanical stress<br>♦ Unusual materials required<br>♦ Large drive transistors<br>♦ Cavitation causes actuator failure<br>♦ Kogation reduces bubble formation<br>♦ Large print heads are difficult to fabricate | ♦ Canon Bubblejet 1979 Endo et al GB patent 2,007,162<br>♦ Xerox heater-in-pit 1990 Hawkins et al USP 4,899,181<br>♦ Hewlett-Packard TIJ 1982 Vaught et al USP 4,490,728 |
| Piezo-electric | A piezoelectric crystal such as lead lanthanum zirconate (PZT) is electrically activated, and either expands, shears, or bends to apply pressure to the ink, ejecting drops. | ♦ Low power consumption<br>♦ Many ink types can be used<br>♦ Fast operation<br>♦ High efficiency | ♦ Very large area required for actuator<br>♦ Difficult to integrate with electronics<br>♦ High voltage drive transistors required<br>♦ Full pagewidth print heads impractical due to actuator size<br>♦ Requires electrical poling in high field strengths during manufacture | ♦ Kyser et al USP 3,946,398<br>♦ Zoltan USP 3,683,212<br>♦ 1973 Stemme USP 3,747,120<br>♦ Epson Stylus<br>♦ Tektronix<br>♦ IJ04 |
| Electro-strictive | An electric field is used to activate electrostriction in relaxor materials such as lead lanthanum zirconate titanate (PLZT) or lead magnesium niobate (PMN). | ♦ Low power consumption<br>♦ Many ink types can be used<br>♦ Low thermal expansion<br>♦ Electric field strength required (approx. 3.5 V/μm) can be generated without difficulty<br>♦ Does not require electrical poling | ♦ Low maximum strain (approx. 0.01%)<br>♦ Large area required for actuator due to low strain<br>♦ Response speed is marginal (~10 μs)<br>♦ High voltage drive transistors required<br>♦ Full pagewidth print heads impractical due to actuator size | ♦ Seiko Epson, Usui et all JP 253401/96<br>♦ IJ04 |
| Ferro-electric | An electric field is used to induce a phase transition between the antiferroelectric (AFE) and ferroelectric (FE) phase. Perovskite materials such as tin modified lead lanthanum zirconate titanate (PLZSnT) exhibit large strains of up to 1% associated with the AFE to FE phase transition. | ♦ Low power consumption<br>♦ Many ink types can be used<br>♦ Fast operation (<1 μs)<br>♦ Relatively high longitudinal strain<br>♦ High efficiency<br>♦ Electric field strength of around 3 V/μm can be readily provided | ♦ Difficult to integrate with electronics<br>♦ Unusual materials such as PLZSnT are required<br>♦ Actuators require a large area | ♦ IJ04 |
| Electro-static plates | Conductive plates are separated by a compressible or fluid dielectric (usually air). Upon application of a voltage, the plates attract each other and displace ink, causing drop ejection. The conductive plates may be in a comb or honeycomb structure, or stacked to increase the surface area and therefore the force. | ♦ Low power consumption<br>♦ Many ink types can be used<br>♦ Fast operation | ♦ Difficult to operate electrostatic devices in an aqueous environment<br>♦ The electrostatic actuator will normally need to be separated from the ink<br>♦ Very large area required to achieve high forces<br>♦ High voltage drive transistors may be required<br>♦ Full pagewidth print | ♦ IJ02, IJ04 |

-continued

|  | Description | Advantages | Disadvantages | Examples |
| --- | --- | --- | --- | --- |
| Electro-static pull on ink | A strong electric field is applied to the ink, whereupon electrostatic attraction accelerates the ink towards the print medium. | ◆ Low current consumption<br>◆ Low temperature | heads are not competitive due to actuator size<br>◆ High voltage required<br>◆ May be damaged by sparks due to air breakdown<br>◆ Required field strength increases as the drop size decreases<br>◆ High voltage drive transistors required<br>◆ Electrostatic field attracts dust | ◆ 1989 Saito et al, USP 4,799,068<br>◆ 1989 Miura et al, USP 4,810,954<br>◆ Tone-jet |
| Permanent magnet electro-magnetic | An electromagnet directly attracts a permanent magnet, displacing ink and causing drop ejection. Rare earth magnets with a field strength around 1 Tesla can be used. Examples are: Samarium Cobalt (SaCo) and magnetic materials in the neodymium iron boron family (NdFeB, NdDyFeBNb, NdDyFeB, etc) | ◆ Low power consumption<br>◆ Many ink types can be used<br>◆ Fast operation<br>◆ High efficiency<br>◆ Easy extension from single nozzles to pagewidth print heads | ◆ Complex fabrication<br>◆ Permanent magnetic material such as Neodymium Iron Boron (NdFeB) required.<br>◆ High local currents required<br>◆ Copper metalization should be used for long electromigration lifetime and low resistivity<br>◆ Pigmented inks are usually infeasible<br>◆ Operating temperature limited to the Curie temperature (around 540K) | ◆ IJ07, IJ10 |
| Soft magnetic core electro-magnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the two parts attract, displacing the ink. | ◆ Low power consumption<br>◆ Many ink types can be used<br>◆ Fast operation<br>◆ High efficiency<br>◆ Easy extension from single nozzles to pagewidth print heads | ◆ Complex fabrication<br>◆ Materials not usually present in a CMOS fab such as NiFe, CoNiFe, or CoFe are required<br>◆ High local currents required<br>◆ Copper metalization should be used for long electromigration lifetime and low resistivity<br>◆ Electroplating is required<br>◆ High saturation flux density is required (2.0–2.1 T is achievable with CoNiFe [1]) | ◆ IJ01, IJ05, IJ08, IJ10, IJ12, IJ14, IJ15, IJ17 |
| Lorenz force | The Lorenz force acting on a current carrying wire in a magnetic field is utilized. This allows the magnetic field to be supplied externally to the print head, for example with rare earth permanent magnets. Only the current carrying wire need be fabricated on the print-head, simplifying materials requirements. | ◆ Low power consumption<br>◆ Many ink types can be used<br>◆ Fast operation<br>◆ High efficiency<br>◆ Easy extension from single nozzles to pagewidth print heads | ◆ Force acts as a twisting motion<br>◆ Typically, only a quarter of the solenoid length provides force in a useful direction<br>◆ High local currents required<br>◆ Copper metalization should be used for long electromigration lifetime and low resistivity<br>◆ Pigmented inks are usually infeasible | ◆ IJ06, IJ11, IJ13, IJ16 |
| Magneto- | The actuator uses the | ◆ Many ink types can | ◆ Force acts as a | ◆ Fischenbeck, USP |

-continued

| | Description | Advantages | Disadvantages | Examples |
|---|---|---|---|---|
| striction | giant magnetostrictive effect of materials such as Terfenol-D (an alloy of terbium, dysprosium and iron developed at the Naval Ordnance Laboratory, hence Ter-Fe-NOL). For best efficiency, the actuator should be pre-stressed to approx. 8 MPa. | ◆ Fast operation<br>◆ Easy extension from single nozzles to pagewidth print heads<br>◆ High force is available | twisting motion<br>◆ Unusual materials such as Terfenol-D are required<br>◆ High local currents required<br>◆ Copper metalization should be used for long electromigration lifetime and low resistivity<br>◆ Pre-stressing may be required | 4,032,929<br>IJ25 |
| Surface tension reduction | Ink under positive pressure is held in a nozzle by surface tension. The surface tension of the ink is reduced below the bubble threshold, causing the ink to egress from the nozzle. | ◆ Low power consumption<br>◆ Simple construction<br>◆ No unusual materials required in fabrication<br>◆ High efficiency<br>◆ Easy extension from single nozzles to pagewidth print heads | ◆ Requires supplementary force to effect drop separation<br>◆ Requires special ink surfactants<br>◆ Speed may be limited by surfactant properties | ◆ Silverbrook, EP 0771 658 A2 and related patent applications |
| Viscosity reduction | The ink viscosity is locally reduced to select which drops are to be ejected. A viscosity reduction can be achieved electrothermally with most inks, but special inks can be engineered for a 100:1 viscosity reduction. | ◆ Simple construction<br>◆ No unusual materials required in fabrication<br>◆ Easy extension from single nozzles to pagewidth print heads | ◆ Requires supplementary force to effect drop separation<br>◆ Requires special ink viscosity properties<br>◆ High speed is difficult to achieve<br>◆ Requires oscillating ink pressure<br>◆ A high temperature difference (typically 80 degrees) is required | ◆ Silverbrook, EP 0771 658 A2 and related patent applications |
| Acoustic | An acoustic wave is generated and focussed upon the drop ejection region. | ◆ Can operate without a nozzle plate | ◆ Complex drive circuitry<br>◆ Complex fabrication<br>◆ Low efficiency<br>◆ Poor control of drop position<br>◆ Poor control of drop volume | ◆ 1993 Hadimioglu et al, EUP 550,192<br>◆ 1993 Elrod et al, EUP 572,220 |
| Thermo-elastic bend actuator | An actuator which relies upon differential thermal expansion upon Joule heating is used. | ◆ Low power consumption<br>◆ Many ink types can be used<br>◆ Simple planar fabrication<br>◆ Small chip area required for each actuator<br>◆ Fast operation<br>◆ High efficiency<br>◆ CMOS compatible voltages and currents<br>◆ Standard MEMS processes can be used<br>◆ Easy extension from single nozzles to pagewidth print heads | ◆ Efficient aqueous operation requires a thermal insulator on the hot side<br>◆ Corrosion prevention can be difficult<br>◆ Pigmented inks may be infeasible, as pigment particles may jam the bend actuator | ◆ IJ03, IJ09, IJ17, IJ18, IJ19, IJ20, IJ21, IJ22, IJ23, IJ24, IJ27, IJ28, IJ29, IJ30, IJ31, IJ32, IJ33, IJ34, IJ35, IJ36, IJ37, IJ38, IJ39, IJ40, IJ41 |
| High CTE thermo-elastic actuator | A material with a very high coefficient of thermal expansion (CTE) such as polytetrafluoroethylene (PTFE) is used. As high CTE materials are usually non-conductive, a heater | ◆ High force can be generated<br>◆ Three methods of PTFE deposition are under development: chemical vapor deposition (CVD), spin coating, and evaporation | ◆ Requires special material (e.g. PTFE)<br>◆ Requires a PTFE deposition process, which is not yet standard in ULSI fabs<br>◆ PTFE deposition cannot be followed | ◆ IJ09, IJ17, IJ18, IJ20, IJ21, IJ22, IJ23, IJ24, IJ27, IJ28, IJ29, IJ30, IJ31, IJ42, IJ43, IJ44 |

-continued

| | Description | Advantages | Disadvantages | Examples |
|---|---|---|---|---|
| | fabricated from a conductive material is incorporated. A 50 μm long PTFE bend actuator with polysilicon heater and 15 mW power input can provide 180 μN force and 10 μm deflection. Actuator motions include:<br>Bend<br>Push<br>Buckle<br>Rotate | ◆ PTFE is a candidate for low dielectric constant insulation in ULSI<br>◆ Very low power consumption<br>◆ Many ink types can be used<br>◆ Simple planar fabrication<br>◆ Small chip area required for each actuator<br>◆ Fast operation<br>◆ High efficiency<br>◆ CMOS compatible voltages and currents<br>◆ Easy extension from single nozzles to pagewidth print heads | with high temperature (above 350° C.) processing<br>◆ Pigmented inks may be infeasible, as pigment particles may jam the bend actuator | |
| Conductive polymer thermoelastic actuator | A polymer with a high coefficient of thermal expansion (such as PTFE) is doped with conducting substances to increase its conductivity to about 3 orders of magnitude below that of copper. The conducting polymer expands when resistively heated.<br>Examples of conducting dopants include:<br>Carbon nanotubes<br>Metal fibers<br>Conductive polymers such as doped polythiophene<br>Carbon granules | ◆ High force can be generated<br>◆ Very low power consumption<br>◆ Many ink types can be used<br>◆ Simple planar fabrication<br>◆ Small chip area required for each actuator<br>◆ Fast operation<br>◆ High efficiency<br>◆ CMOS compatible voltages and currents<br>◆ Easy extension from single nozzles to pagewidth print heads | ◆ Requires special materials development (High CTE conductive polymer)<br>◆ Requires a PTFE deposition process, which is not yet standard in ULSI fabs<br>◆ PTFE deposition cannot be followed with high temperature (above 350° C.) processing<br>◆ Evaporation and CVD deposition techniques cannot be used<br>◆ Pigmented inks may be infeasible, as pigment particles may jam the bend actuator | ◆ IJ24 |
| Shape memory alloy | A shape memory alloy such as TiNi (also known as Nitinol - Nickel Titanium alloy developed at the Naval Ordnance Laboratory) is thermally switched between its weak martensitic state and its high stiffness austenic state. The shape of the actuator in its martensitic state is deformed relative to the austenic shape. The shape change causes ejection of a drop. | ◆ High force is available (stresses of hundreds of MPa)<br>◆ Large strain is available (more than 3%)<br>◆ High corrosion resistance<br>◆ Simple construction<br>◆ Easy extension from single nozzles to pagewidth print heads<br>◆ Low voltage operation | ◆ Fatigue limits maximum number of cycles<br>◆ Low strain (1%) is required to extend fatigue resistance<br>◆ Cycle rate limited by heat removal<br>◆ Requires unusual materials (TiNi)<br>◆ The latent heat of transformation must be provided<br>◆ High current operation<br>◆ Requires pre-stressing to distort the martensitic state | ◆ IJ26 |
| Linear Magnetic Actuator | Linear magnetic actuators include the Linear Induction Actuator (LIA), Linear Permanent Magnet Synchronous Actuator (LPMSA), Linear Reluctance Synchronous Actuator (LRSA), Linear Switched Reluctance Actuator (LSRA), and the Linear Stepper | ◆ Linear Magnetic actuators can be constructed with high thrust, long travel, and high efficiency using planar semiconductor fabrication techniques<br>◆ Long actuator travel is available<br>◆ Medium force is | ◆ Requires unusual semiconductor materials such as soft magnetic alloys (e.g. CoNiFe)<br>◆ Some varieties also require permanent magnetic materials such as Neodymium iron boron (NcFeB)<br>◆ Requires complex multi-phase drive circuitry | ◆ IJ12 |

-continued

| | Description | Advantages | Disadvantages | Examples |
|---|---|---|---|---|
| | Actuator (LSA). | ◆ available<br>◆ Low voltage operation | ◆ High current operation | |

BASIC OPERATION MODE

| | Description | Advantages | Disadvantages | Examples |
|---|---|---|---|---|
| Actuator directly pushes ink | This is the simplest mode of operation: the actuator directly supplies sufficient kinetic energy to expel the drop. The drop must have a sufficient velocity to overcome the surface tension. | ◆ Simple operation<br>◆ No external fields required<br>◆ Satellite drops can be avoided if drop velocity is less than 4 m/s<br>◆ Can be efficient, depending upon the actuator used | ◆ Drop repetition rate is usually limited to around 10 kHz. However, this is not fundamental to the method, but is related to the refill method normally used<br>◆ All of the drop kinetic energy must be provided by the actuator<br>◆ Satellite drops usually form if drop velocity is greater than 4.5 m/s | ◆ Thermal ink jet<br>◆ Piezoelectric ink jet<br>◆ IJ01, IJ02, IJ03, IJ04, IJ05, IJ06, IJ07, IJ09, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Proximity | The drops to be printed are selected by some manner (e.g. thermally induced surface tension reduction of pressurized ink). Selected drops are separated from the ink in the nozzle by contact with the print medium or a transfer roller. | ◆ Very simple print head fabrication can be used<br>◆ The drop selection means does not need to provide the energy required to separate the drop from the nozzle | ◆ Requires close proximity between the print head and the print media or transfer roller<br>◆ May require two print heads printing alternate rows of the image<br>◆ Monolithic color print heads are difficult | ◆ Silverbrook, EP 0771 658 A2 and related patent applications |
| Electro-static pull on ink | The drops to be printed are selected by some manner (e.g. thermally induced surface tension reduction of pressurized ink). Selected drops are separated from the ink in the nozzle by a strong electric field. | ◆ Very simple print head fabrication can be used<br>◆ The drop selection means does not need to provide the energy required to separate the drop from the nozzle | ◆ Requires very high electrostatic field<br>◆ Electrostatic field for small nozzle sizes is above air breakdown<br>◆ Electrostatic field may attract dust | ◆ Silverbrook, EP 0771 658 A2 and related patent applications<br>◆ Tone-Jet |
| Magnetic pull on ink | The drops to be printed are selected by some manner (e.g. thermally induced surface tension reduction of pressurized ink). Selected drops are separated from the ink in the nozzle by a strong magnetic field acting on the magnetic ink. | ◆ Very simple print head fabrication can be used<br>◆ The drop selection means does not need to provide the energy required to separate the drop from the nozzle | ◆ Requires magnetic ink<br>◆ Ink colors other than black are difficult<br>◆ Requires very high magnetic fields | ◆ Silverbrook, EP 0771 658 A2 and related patent applications |
| Shutter | The actuator moves a shutter to block ink flow to the nozzle. The ink pressure is pulsed at a multiple of the drop ejection frequency. | ◆ High speed (>50 kHz) operation can be achieved due to reduced refill time<br>◆ Drop timing can be very accurate<br>◆ The actuator energy can be very low | ◆ Moving parts are required<br>◆ Requires ink pressure modulator<br>◆ Friction and wear must be considered<br>◆ Stiction is possible | ◆ IJ13, IJ17, IJ21 |
| Shuttered grill | The actuator moves a shutter to block ink flow through a grill to the nozzle. The shutter movement need only be equal to the width of the grill holes. | ◆ Actuators with small travel can be used<br>◆ Actuators with small force can be used<br>◆ High speed (>50 kHz) operation can be achieved | ◆ Moving parts are required<br>◆ Requires ink pressure modulator<br>◆ Friction and wear must be considered<br>◆ Stiction is possible | ◆ IJ08, IJ15, IJ18, IJ19 |
| Pulsed | A pulsed magnetic | ◆ Extremely low | ◆ Requires an external | ◆ IJ10 |

-continued

| | Description | Advantages | Disadvantages | Examples |
|---|---|---|---|---|
| magnetic pull on ink pusher | field attracts an 'ink pusher' at the drop ejection frequency. An actuator controls a catch, which prevents the ink pusher from moving when a drop is not to be ejected. | ◆ energy operation is possible<br>◆ No heat dissipation problems | ◆ pulsed magnetic field<br>◆ Requires special materials for both the actuator and the ink pusher<br>◆ Complex construction | |

AUXILIARY MECHANISM (APPLIED TO ALL NOZZLES)

| | Description | Advantages | Disadvantages | Examples |
|---|---|---|---|---|
| None | The actuator directly fires the ink drop, and there is no external field or other mechanism required. | ◆ Simplicity of construction<br>◆ Simplicity of operation<br>◆ Small physical size | ◆ Drop ejection energy must be supplied by individual nozzle actuator | ◆ Most ink jets, including piezoelectric and thermal bubble.<br>◆ IJ01, IJ02, IJ03, IJ04, IJ05, IJ07, IJ09, IJ11, IJ12, IJ14, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Oscillating ink pressure (including acoustic stimulation) | The ink pressure oscillates, providing much of the drop ejection energy. The actuator selects which drops are to be fired by selectively blocking or enabling nozzles. The ink pressure oscillation may be achieved by vibrating the print head, or preferably by an actuator in the ink supply. | ◆ Oscillating ink pressure can provide a refill pulse, allowing higher operating speed<br>◆ The actuators may operate with much lower energy<br>◆ Acoustic lenses can be used to focus the sound on the nozzles | ◆ Requires external ink pressure oscillator<br>◆ Ink pressure phase and amplitude must be carefully controlled<br>◆ Acoustic reflections in the ink chamber must be designed for | ◆ Silverbrook, EP 0771 658 A2 and related patent applications<br>◆ IJ08, IJ13, IJ15, IJ17, IJ18, IJ19, IJ21 |
| Media proximity | The print head is placed in close proximity to the print medium. Selected drops protrude from the print head further than unselected drops, and contact the print medium. The drop soaks into the medium fast enough to cause drop separation. | ◆ Low power<br>◆ High accuracy<br>◆ Simple print head construction | ◆ Precision assembly required<br>◆ Paper fibers may cause problems<br>◆ Cannot print on rough substrates | ◆ Silverbrook, EP 0771 658 A2 and related patent applications |
| Transfer roller | Drops are printed to a transfer roller instead of straight to the print medium. A transfer roller can also be used for proximity drop separation. | ◆ High accuracy<br>◆ Wide range of print substrates can be used<br>◆ Ink can be dried on the transfer roller | ◆ Bulky<br>◆ Expensive<br>◆ Complex construction | ◆ Silverbrook, EP 0771 658 A2 and related patent applications<br>◆ Tektronix hot melt piezoelectric ink jet<br>◆ Any of the IJ series |
| Electrostatic | An electric field is used to accelerate selected drops towards the print medium. | ◆ Low power<br>◆ Simple print head construction | ◆ Field strength required for separation of small drops is near or above air breakdown | ◆ Silverbrook, EP 0771 658 A2 and related patent applications<br>◆ Tone-Jet |
| Direct magnetic field | A magnetic field is used to accelerate selected drops of magnetic ink towards the print medium. | ◆ Low power<br>◆ Simple print head construction | ◆ Requires magnetic ink<br>◆ Requires strong magnetic field | ◆ Silverbrook, EP 0771 658 A2 and related patent applications |
| Cross magnetic field | The print head is placed in a constant magnetic field. The Lorenz force in a current carrying wire is used to move the | ◆ Does not require magnetic materials to be integrated in the print head manufacturing process | ◆ Requires external magnet<br>◆ Current densities may be high, resulting in electromigration | ◆ IJ06, IJ16 |

-continued

| | Description | Advantages | Disadvantages | Examples |
|---|---|---|---|---|
| Pulsed magnetic field | actuator. A pulsed magnetic field is used to cyclically attract a paddle, which pushes on the ink. A small actuator moves a catch, which selectively prevents the paddle from moving. | ◆ Very low power operation is possible<br>◆ Small print head size | problems<br>◆ Complex print head construction<br>◆ Magnetic materials required in print head | ◆ IJ10 |
| ACTUATOR AMPLIFICATION OR MODIFICATION METHOD | | | | |
| None | No actuator mechanical amplification is used. The actuator directly drives the drop ejection process. | ◆ Operational simplicity | ◆ Many actuator mechanisms have insufficient travel, or insufficient force, to efficiently drive the drop ejection process | ◆ Thermal Bubble Ink jet<br>◆ IJ01, IJ02, IJ06, IJ07, IJ16, IJ25, IJ26 |
| Differential expansion bend actuator | An actuator material expands more on one side than on the other. The expansion may be thermal, piezoelectric, magnetostrictive, or other mechanism. The bend actuator converts a high force low travel actuator mechanism to high travel, lower force mechanism. | ◆ Provides greater travel in a reduced print head area | ◆ High stresses are involved<br>◆ Care must be taken that the materials do not delaminate<br>◆ Residual bend resulting from high temperature or high stress during formation | ◆ Piezoelectric<br>◆ IJ03, IJ09, IJ17, IJ18, IJ19, IJ20, IJ21, IJ22, IJ23, IJ24, IJ27, IJ29, IJ30, IJ31, IJ32, IJ33, IJ34, IJ35, IJ36, IJ37, IJ38, IJ39, IJ42, IJ43, IJ44 |
| Transient bend actuator | A trilayer bend actuator where the two outside layers are identical. This cancels bend due to ambient temperature and residual stress. The actuator only responds to transient heating of one side or the other. | ◆ Very good temperature stability<br>◆ High speed, as a new drop can be fired before heat dissipates<br>◆ Cancels residual stress of formation | ◆ High stresses are involved<br>◆ Care must be taken that the materials do not delaminate | ◆ IJ40, IJ41 |
| Reverse spring | The actuator loads a spring. When the actuator is turned off, the spring releases. This can reverse the force/distance curve of the actuator to make it compatible with the force/time requirements of the drop ejection. | ◆ Better coupling to the ink | ◆ Fabrication complexity<br>◆ High stress in the spring | ◆ IJ05, IJ11 |
| Actuator stack | A series of thin actuators are stacked. This can be appropriate where actuators require high electric field strength, such as electrostatic and piezoelectric actuators. | ◆ Increased travel<br>◆ Reduced drive voltage | ◆ Increased fabrication complexity<br>◆ Increased possibility of short circuits due to pinholes | ◆ Some piezoelectric ink jets<br>◆ IJ04 |
| Multiple actuators | Multiple smaller actuators are used simultaneously to move the ink. Each actuator need provide only a portion of the force required. | ◆ Increases the force available from an actuator<br>◆ Multiple actuators can be positioned to control ink flow accurately | ◆ Actuator forces may not add linearly, reducing efficiency | ◆ IJ12, IJ13, IJ18, IJ20, IJ22, IJ28, IJ42, IJ43 |
| Linear Spring | A linear spring is used to transform a motion with small travel and high force into a longer travel, lower force motion. | ◆ Matches low travel actuator with higher travel requirements<br>◆ Non-contact method of motion transformation | ◆ Requires print head area for the spring | ◆ IJ15 |
| Coiled actuator | A bend actuator is coiled to provide | ◆ Increases travel<br>◆ Reduces chip area | ◆ Generally restricted to planar | ◆ IJ17, IJ21, IJ34, IJ35 |

|  | Description | Advantages | Disadvantages | Examples |
| --- | --- | --- | --- | --- |
|  | greater travel in a reduced chip area. | ◆ Planar implementations are relatively easy to fabricate. | implementations due to extreme fabrication difficulty in other orientations. |  |
| Flexure bend actuator | A bend actuator has a small region near the fixture point, which flexes much more readily than the remainder of the actuator. The actuator flexing is effectively converted from an even coiling to an angular bend, resulting in greater travel of the actuator tip. | ◆ Simple means of increasing travel of a bend actuator | ◆ Care must be taken not to exceed the elastic limit in the flexure area<br>◆ Stress distribution is very uneven<br>◆ Difficult to accurately model with finite element analysis | ◆ IJ10, IJ19, IJ33 |
| Catch | The actuator controls a small catch. The catch either enables or disables movement of an ink pusher that is controlled in a bulk manner. | ◆ Very low actuator energy<br>◆ Very small actuator size | ◆ Complex construction<br>◆ Requires external force<br>◆ Unsuitable for pigmented inks | ◆ IJ10 |
| Gears | Gears can be used to increase travel at the expense of duration. Circular gears, rack and pinion, ratchets, and other gearing methods can be used. | ◆ Low force, low travel actuators can be used<br>◆ Can be fabricated using standard surface MEMS processes | ◆ Moving parts are required<br>◆ Several actuator cycles are required<br>◆ More complex drive electronics<br>◆ Complex construction<br>◆ Friction, friction, and wear are possible | ◆ IJ13 |
| Buckle plate | A buckle plate can be used to change a slow actuator into a fast motion. It can also convert a high force, low travel actuator into a high travel, medium force motion. | ◆ Very fast movement achievable | ◆ Must stay within elastic limits of the materials for long device life<br>◆ High stresses involved<br>◆ Generally high power requirement | ◆ S. Hirata et al, "An Ink-jet Head Using Diaphragm Microactuator", Proc. IEEE MEMS, Feb. 1996, pp 418–423.<br>◆ IJ18, IJ27 |
| Tapered magnetic pole | A tapered magnetic pole can increase travel at the expense of force. | ◆ Linearizes the magnetic force/distance curve | ◆ Complex construction | ◆ IJ14 |
| Lever | A lever and fulcrum is used to transform a motion with small travel and high force into a motion with longer travel and lower force. The lever can also reverse the direction of travel. | ◆ Matches low travel actuator with higher travel requirements<br>◆ Fulcrum area has no linear movement, and can be used for a fluid seal | ◆ High stress around the fulcrum | ◆ IJ32, IJ36, IJ37 |
| Rotary impeller | The actuator is connected to a rotary impeller. A small angular deflection of the actuator results in a rotation of the impeller vanes, which push the ink against stationary vanes and out of the nozzle. | ◆ High mechanical advantage<br>◆ The ratio of force to travel of the actuator can be matched to the nozzle requirements by varying the number of impeller vanes | ◆ Complex construction<br>◆ Unsuitable for pigmented inks | ◆ IJ28 |
| Acoustic lens | A refractive or diffractive (e.g. zone plate) acoustic lens is used to concentrate sound waves. | ◆ No moving parts | ◆ Large area required<br>◆ Only relevant for acoustic ink jets | ◆ 1993 Hadimioglu et al, EUP 550,192<br>◆ 1993 Elrod et al, EUP 572,220 |
| Sharp conductive point | A sharp point is used to concentrate an electrostatic field. | ◆ Simple construction | ◆ Difficult to fabricate using standard VLSI processes for a surface ejecting ink-jet<br>◆ Only relevant for | ◆ Tone-jet |

-continued electrostatic ink jets

ACTUATOR MOTION

| | Description | Advantages | Disadvantages | Examples |
|---|---|---|---|---|
| Volume expansion | The volume of the actuator changes, pushing the ink in all directions. | ◆ Simple construction in the case of thermal ink jet | ◆ High energy is typically required to achieve volume expansion. This leads to thermal stress, cavitation, and kogation in thermal ink jet implementations | ◆ Hewlett-Packard Thermal Ink jet<br>◆ Canon Bubblejet |
| Linear, normal to chip surface | The actuator moves in a direction normal to the print head surface. The nozzle is typically in the line of movement. | ◆ Efficient coupling to ink drops ejected normal to the surface | ◆ High fabrication complexity may be required to achieve perpendicular motion | ◆ IJ01, IJ02, IJ04, IJ07, IJ11, IJ14 |
| Parallel to chip surface | The actuator moves parallel to the print head surface. Drop ejection may still be normal to the surface | ◆ Suitable for planar fabrication | ◆ Fabrication complexity<br>◆ Friction<br>◆ Stiction | ◆ IJ12, IJ13, IJ15, IJ33, IJ34, IJ35, IJ36 |
| Membrane push | An actuator with a high force but small area is used to push a stiff membrane that is in contact with the ink. | ◆ The effective area of the actuator becomes the membrane area | ◆ Fabrication complexity<br>◆ Actuator size<br>◆ Difficulty of integration in a VLSI process | ◆ 1982 Howkins USP 4,459,601 |
| Rotary | The actuator causes the rotation of some element, such a grill or impeller | ◆ Rotary levers may be used to increase travel<br>◆ Small chip area requirements | ◆ Device complexity<br>◆ May have friction at a pivot point | ◆ IJ05, IJ08, IJ13, IJ28 |
| Bend | The actuator bends when energized. This may be due to differential thermal expansion, piezoelectric expansion, magnetostriction, or other form of relative dimensional change. | ◆ A very small change in dimensions can be converted to a large motion. | ◆ Requires the actuator to be made from at least two distinct layers, or to have a thermal difference across the actuator | ◆ 1970 Kyser et al USP 3,946,398<br>◆ 1973 Stemine USP 3,747,120<br>◆ IJ03, IJ09, IJ10, IJ19, IJ23, IJ24, IJ25, IJ29, IJ30, IJ31, IJ33, IJ34, IJ35 |
| Swivel | The actuator swivels around a central pivot. This motion is suitable where there are opposite forces applied to opposite sides of the paddle, e.g. Lorenz force. | ◆ Allows operation where the net linear force on the paddle is zero<br>◆ Small chip area requirements | ◆ Inefficient coupling to the ink motion | ◆ IJ06 |
| Straighten | The actuator is normally bent, and straightens when energized. | ◆ Can be used with shape memory alloys where the austenic phase is planar | ◆ Requires careful balance of stresses to ensure that the quiescent bend is accurate | ◆ IJ26, IJ32 |
| Double bend | The actuator bends in one direction when one element is energized, and bends the other way when another element is energized. | ◆ One actuator can be used to power two nozzles.<br>◆ Reduced chip size.<br>◆ Not sensitive to ambient temperature | ◆ Difficult to make the drops ejected by both bend directions identical.<br>◆ A small efficiency loss compared to equivalent single bend actuators. | ◆ IJ36, IJ37, IJ38 |
| Shear | Energizing the actuator causes a shear motion in the actuator material. | ◆ Can increase the effective travel of piezoelectric actuators | ◆ Not readily applicable to other actuator mechanisms | ◆ 1985 Fishbeck USP 4,584,590 |
| Radial constriction | The actuator squeezes an ink reservoir, forcing ink from a constricted nozzle. | ◆ Relatively easy to fabricate single nozzles from glass tubing as macroscopic structures | ◆ High force required<br>◆ Inefficient<br>◆ Difficult to integrate with VLSI processes | ◆ 1970 Zoltan USP 3,683,212 |
| Coil/ uncoil | A coiled actuator uncoils or coils more | ◆ Easy to fabricate as a planar VLSI | ◆ Difficult to fabricate for non-planar | ◆ IJ17, IJ21, IJ34, IJ35 |

-continued

|  | Description | Advantages | Disadvantages | Examples |
|---|---|---|---|---|
|  | tightly. The motion of the free end of the actuator ejects the ink. | ♦ process<br>♦ Small area required, therefore low cost | ♦ devices<br>♦ Poor out-of-plane stiffness |  |
| Bow | The actuator bows (or buckles) in the middle when energized. | ♦ Can increase the speed of travel<br>♦ Mechanically rigid | ♦ Maximum travel is constrained<br>♦ High force required | ♦ IJ16, IJ18, IJ27 |
| Push-Pull | Two actuators control a shutter. One actuator pulls the shutter, and the other pushes it. | ♦ The structure is pinned at both ends, so has a high out-of-plane rigidity | ♦ Not readily suitable for ink jets which directly push the ink | ♦ IJ18 |
| Curl inwards | A set of actuators curl inwards to reduce the volume of ink that they enclose. | ♦ Good fluid flow to the region behind the actuator increases efficiency | ♦ Design complexity | ♦ IJ20, IJ42 |
| Curl outwards | A set of actuators curl outwards, pressurizing ink in a chamber surrounding the actuators, and expelling ink from a nozzle in the chamber. | ♦ Relatively simple construction | ♦ Relatively large chip area | ♦ IJ43 |
| Iris | Multiple vanes enclose a volume of ink. These simultaneously rotate, reducing the volume between the vanes. | ♦ High efficiency<br>♦ Small chip area | ♦ High fabrication complexity<br>♦ Not suitable for pigmented inks | ♦ IJ22 |
| Acoustic vibration | The actuator vibrates at a high frequency. | ♦ The actuator can be physically distant from the ink<br>♦ Acoustic coupling and crosstalk<br>♦ Complex drive circuitry<br>♦ Poor control of drop volume and position | ♦ Large area required for efficient operation at useful frequencies | ♦ 1993 Hadimioglu et al, EUP 550,192<br>♦ 1993 Elrod et al, EUP 572,220 |
| None | In various ink jet designs the actuator does not move. | ♦ No moving parts | ♦ Various other tradeoffs are required to eliminate moving parts | ♦ Silverbrook, EP 0771 658 A2 and related patent applications<br>♦ Tone-jet |

NOZZLE REFILL METHOD

|  | Description | Advantages | Disadvantages | Examples |
|---|---|---|---|---|
| Surface tension | This is the normal way that ink jets are refilled. After the actuator is energized, it typically returns rapidly to its normal position. This rapid return sucks in air through the nozzle opening. The ink surface tension at the nozzle then exerts a small force restoring the meniscus to a minimum area. This force refills the nozzle. | ♦ Fabrication simplicity<br>♦ Operational simplicity | ♦ Low speed<br>♦ Surface tension force relatively small compared to actuator force<br>♦ Long refill time usually dominates the total repetition rate | ♦ Thermal ink jet<br>♦ Piezoelectric ink jet<br>♦ IJ01–IJ07, IJ10–IJ14, IJ16, IJ20, IJ22–IJ45 |
| Shuttered oscillating ink pressure | Ink to the nozzle chamber is provided at a pressure that oscillates at twice the drop ejection frequency. When a drop is to be ejected, the shutter is opened for 3 half cycles: drop ejection, actuator return, and refill. The shutter is then closed to prevent the nozzle chamber emptying during the next negative pressure cycle. | ♦ High speed<br>♦ Low actuator energy, as the actuator need only open or close the shutter, instead of ejecting the ink drop | ♦ Requires common ink pressure oscillator<br>♦ May not be suitable for pigmented inks | ♦ IJ08, IJ13, IJ15, IJ17, IJ18, IJ19, IJ21 |
| Refill | After the main | ♦ High speed, as the | ♦ Requires two | ♦ IJ09 |

-continued

| | Description | Advantages | Disadvantages | Examples |
|---|---|---|---|---|
| actuator | actuator has ejected a drop a second (refill) actuator is energized. The refill actuator pushes ink into the nozzle chamber. The refill actuator returns slowly, to prevent its return from emptying the chamber again. | nozzle is actively refilled | independent actuators per nozzle | |
| Positive ink pressure | The ink is held a slight positive pressure. After the ink drop is ejected, the nozzle chamber fills quickly as surface tension and ink pressure both operate to refill the nozzle. | ◆ High refill rate, therefore a high drop repetition rate is possible | ◆ Surface spill must be prevented<br>◆ Highly hydrophobic print head surfaces are required | ◆ Silverbrook, EP 0771 658 A2 and related patent applications<br>◆ Alternative for:, IJ01–IJ07, IJ10–IJ14, IJ16, IJ20, IJ22–IJ45 |

METHOD OF RESTRICTING BACK-FLOW THROUGH INLET

| | Description | Advantages | Disadvantages | Examples |
|---|---|---|---|---|
| Long inlet channel | The ink inlet channel to the nozzle chamber is made long and relatively narrow, relying on viscous drag to reduce inlet back-flow. | ◆ Design simplicity<br>◆ Operational simplicity<br>◆ Reduces crosstalk | ◆ Restricts refill rate<br>◆ May result in a relatively large chip area<br>◆ Only partially effective | ◆ Thermal ink jet<br>◆ Piezoelectric ink jet IJ42, IJ43 |
| Positive ink pressure | The ink is under a positive pressure, so that in the quiescent state some of the ink drop already protrudes from the nozzle. This reduces the pressure in the nozzle chamber which is required to eject a certain volume of ink. The reduction in chamber pressure results in a reduction in ink pushed out through the inlet. | ◆ Drop selection and separation forces can be reduced<br>◆ Fast refill time | ◆ Requires a method (such as a nozzle rim or effective hydrophobizing, or both) to prevent flooding of the ejection surface of the print head. | ◆ Silverbrook, EP 0771 658 A2 and related patent applications<br>◆ Possible operation of the following: IJ01–IJ07, IJ09–IJ12, IJ14, IJ16, IJ20, IJ22, , IJ23–IJ34, IJ36–IJ41, IJ44 |
| Baffle | One or more baffles are placed in the inlet ink flow. When the actuator is energized, the rapid ink movement creates eddies which restrict the flow through the inlet. The slower refill process is unrestricted, and does not result in eddies. | ◆ The refill rate is not as restricted as the long inlet method.<br>◆ Reduces crosstalk | ◆ Design complexity<br>◆ May increase fabrication complexity (e.g. Tektronix hot melt Piezoelectric print heads). | ◆ HP Thermal Ink Jet<br>◆ Tektronix piezoelectric ink jet |
| Flexible flap restricts inlet | In this method recently disclosed by Canon, the expanding actuator (bubble) pushes on a flexible flap that restricts the inlet. | ◆ Significantly reduces back-flow for edge-shooter thermal ink jet devices | ◆ Not applicable to most ink jet configurations<br>◆ Increased fabrication complexity<br>◆ Inelastic deformation of polymer flap results in creep over extended use | ◆ Canon |
| Inlet filter | A filter is located between the ink inlet and the nozzle chamber. The filter has a multitude of small holes or slots, restricting ink flow. The filter also removes particles which may block the nozzle. | ◆ Additional advantage of ink filtration<br>◆ Ink filter may be fabricated with no additional process steps | ◆ Restricts refill rate<br>◆ May result in complex construction | ◆ IJ04, IJ12, IJ24, IJ27, IJ29, IJ30 |

-continued

| | Description | Advantages | Disadvantages | Examples |
|---|---|---|---|---|
| Small inlet compared to nozzle | The ink inlet channel to the nozzle chamber has a substantially smaller cross section than that of the nozzle, resulting in easier ink egress out of the nozzle than out of the inlet. | ◆ Design simplicity | ◆ Restricts refill rate<br>◆ May result in a relatively large chip area<br>◆ Only partially effective | ◆ IJ02, IJ37, IJ44 |
| Inlet shutter | A secondary actuator controls the position of a shutter, closing off the ink inlet when the main actuator is energized. | ◆ Increases speed of the ink-jet print head operation | ◆ Requires separate refill actuator and drive circuit | ◆ IJ09 |
| The inlet is located behind the ink-pushing surface | The method avoids the problem of inlet back-flow by arranging the ink-pushing surface of the actuator between the inlet and the nozzle. | ◆ Back-flow problem is eliminated | ◆ Requires careful design to minimize the negative pressure behind the paddle | ◆ IJ01, IJ03, IJ05, IJ06, IJ07, IJ10, IJ11, IJ14, IJ16, IJ22, IJ23, IJ25, IJ28, IJ31, IJ32, IJ33, IJ34, IJ35, IJ36, IJ39, IJ40, IJ41 |
| Part of the actuator moves to shut off the inlet | The actuator and a wall of the ink chamber are arranged so that the motion of the actuator closes off the inlet. | ◆ Significant reductions in back-flow can be achieved<br>◆ Compact designs possible | ◆ Small increase in fabrication complexity | ◆ IJ07, IJ20, IJ26, IJ38 |
| Nozzle actuator does not result in ink back-flow | In some configurations of ink jet, there is no expansion or movement of an actuator which may cause ink back-flow through the inlet. | ◆ Ink back-flow problem is eliminated | ◆ None related to ink back-flow on actuation | ◆ Silverbrook, EP 0771 658 A2 and related patent applications<br>◆ Valve-jet<br>◆ Tone-jet |

NOZZLE CLEARING METHOD

| | Description | Advantages | Disadvantages | Examples |
|---|---|---|---|---|
| Normal nozzle firing | All of the nozzles are fired periodically, before the ink has a chance to dry. When not in use the nozzles are sealed (capped) against air.<br>The nozzle firing is usually performed during a special clearing cycle, after first moving the print head to a cleaning station. | ◆ No added complexity on the print head | ◆ May not be sufficient to displace dried ink | ◆ Most ink jet systems<br>◆ IJ01, IJ02, IJ03, IJ04, IJ05, IJ06, IJ07, IJ09, IJ10, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink heater | In systems which heat the ink, but do not boil it under normal situations, nozzle clearing can be achieved by over-powering the heater and boiling ink at the nozzle. | ◆ Can be highly effective if the heater is adjacent to the nozzle | ◆ Requires higher drive voltage for clearing<br>◆ May require larger drive transistors | ◆ Silverbrook, EP 0771 658 A2 and related patent applications |
| Rapid succession of actuator pulses | The actuator is fired in rapid succession. In some configurations, this may cause heat build-up at the nozzle which boils the ink, clearing the nozzle. In other situations, it may cause sufficient vibrations to dislodge clogged nozzles. | ◆ Does not require extra drive circuits on the print head<br>◆ Can be readily controlled and initiated by digital logic | ◆ Effectiveness depends substantially upon the configuration of the inkjet nozzle | ◆ May be used with: IJ01, IJ02, IJ03, IJ04, IJ05, IJ06, IJ07, IJ09, IJ10, IJ11, IJ14, IJ16, IJ20, IJ22, IJ23, IJ24, IJ25, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink | Where an actuator is not normally driven to the limit of its motion, | ◆ A simple solution where applicable | ◆ Not suitable where there is a hard limit to actuator | ◆ May be used with: IJ03, IJ09, IJ16, IJ20, IJ23, IJ24, |

-continued

| | Description | Advantages | Disadvantages | Examples |
|---|---|---|---|---|
| pushing actuator | nozzle clearing may be assisted by providing an enhanced drive signal to the actuator. | | movement | IJ25, IJ27, IJ29, IJ30, IJ31, IJ32, IJ39, IJ40, IJ41, IJ42, IJ43, IJ44, IJ45 |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | ♦ A high nozzle clearing capability can be achieved<br>♦ May be implemented at very low cost in systems which already include acoustic actuators | ♦ High implementation cost if system does not already include an acoustic actuator | ♦ IJ08, IJ13, IJ15, 1317, IJ18, IJ19, IJ21 |
| Nozzle clearing plate | A microfabricated plate is pushed against the nozzles. The plate has a post for every nozzle. A post moves through each nozzle, displacing dried ink. | ♦ Can clear severely clogged nozzles | ♦ Accurate mechanical alignment is required<br>♦ Moving parts are required<br>♦ There is risk of damage to the nozzles<br>♦ Accurate fabrication is required | ♦ Silverbrook, EP 0771 658 A2 and related patent applications |
| Ink pressure pulse | The pressure of the ink is temporarily increased so that ink streams from all of the nozzles. This may be used in conjunction with actuator energizing. | ♦ May be effective where other methods cannot be used | ♦ Requires pressure pump or other pressure actuator<br>♦ Expensive<br>♦ Wasteful of ink | ♦ May be used with all IJ series ink jets |
| Print head wiper | A flexible 'blade' is wiped across the print head surface. The blade is usually fabricated from a flexible polymer, e.g. rubber or synthetic elastomer. | ♦ Effective for planar print head surfaces<br>♦ Low cost | ♦ Difficult to use if print head surface is non-planar or very fragile<br>♦ Requires mechanical parts<br>♦ Blade can wear out in high volume print systems | ♦ Many ink jet systems |
| Separate ink boiling heater | A separate heater is provided at the nozzle although the normal drop e-ection mechanism does not require it. The heaters do not require individual drive circuits, as many nozzles can be cleared simultaneously, and no imaging is required. | ♦ Can be effective where other nozzle clearing methods cannot be used<br>♦ Can be implemented at no additional cost in some ink jet configurations | ♦ Fabrication complexity | ♦ Can be used with many IJ series ink jets |

NOZZLE PLATE CONSTRUCTION

| | Description | Advantages | Disadvantages | Examples |
|---|---|---|---|---|
| Electro-formed nickel | A nozzle plate is separately fabricated from electroformed nickel, and bonded to the print head chip. | ♦ Fabrication simplicity | ♦ High temperatures and pressures are required to bond nozzle plate<br>♦ Minimum thickness constraints<br>♦ Differential thermal expansion | ♦ Hewlett Packard Thermal Ink jet |
| Laser ablated or drilled polymer | Individual nozzle holes are ablated by an intense UV laser in a nozzle plate, which is typically a polymer such as polyimide or polysulphone | ♦ No masks required<br>♦ Can be quite fast<br>♦ Some control over nozzle profile is possible<br>▲ Equipment required is relatively low cost | ♦ Each hole must be individually formed<br>♦ Special equipment required<br>♦ Slow where there are many thousands of nozzles per print head | ♦ Canon Bubblejet 1988 Sercel et al., SPIE, Vol. 998 Excimer Beam Applications, pp. 76–83<br>♦ 1993 Watanabe et al., USP 5,208,604 |

| | Description | Advantages | Disadvantages | Examples |
|---|---|---|---|---|
| Silicon micro-machined | A separate nozzle plate is micromachined from single crystal silicon, and bonded to the print head wafer. | ♦ High accuracy is attainable | ♦ May produce thin burrs at exit holes<br>♦ Two part construction<br>♦ High cost<br>♦ Requires precision alignment<br>♦ Nozzles may be clogged by adhesive | ♦ K. Bean, IEEE Transactions on Electron Devices, Vol. ED-25, No. 10, 1978, pp 1185–1195<br>♦ Xerox 1990 Hawkins et al., USP 4,899,181 |
| Glass capillaries | Fine glass capillaries are drawn from glass tubing. This method has been used for making individual nozzles, but is difficult to use for bulk manufacturing of print heads with thousands of nozzles. | ♦ No expensive equipment required<br>♦ Simple to make single nozzles | ♦ Very small nozzle sizes are difficult to form<br>♦ Not suited for mass production | ♦ 1970 Zoltan USP 3,683,212 |
| Mono-lithic, surface micro-machined using VLSI litho-graphic processes | The nozzle plate is deposited as a layer using standard VLSI deposition techniques. Nozzles are etched in the nozzle plate using VLSI lithography and etching. | ♦ High accuracy (<1 μm)<br>♦ Monolithic<br>♦ Low cost<br>♦ Existing processes can be used | ♦ Requires sacrificial layer under the nozzle plate to form the nozzle chamber<br>♦ Surface may be fragile to the touch | ♦ Silverbrook, EP 0771 658 A2 and related patent applications<br>♦ IJ01, IJ02, IJ04, IJ11, IJ12, IJ17, IJ18, IJ20, IJ22, IJ24, IJ27, IJ28, IJ29, IJ30, IJ31, IJ32, IJ33, IJ34, IJ36, IJ37, IJ38, IJ39, IJ40, IJ41, IJ42, IJ43, IJ44 |
| Mono-lithic, etched through substrate | The nozzle plate is a buried etch stop in the wafer. Nozzle chambers are etched in the front of the wafer, and the wafer is thinned from the back side. Nozzles are then etched in the etch stop layer. | ♦ High accuracy (<1 μm)<br>♦ Monolithic<br>♦ Low cost<br>♦ No differential expansion | ♦ Requires long etch times<br>♦ Requires a support wafer | ♦ IJ03, IJ05, IJ06, IJ07, IJ08, IJ09, IJ10, IJ13, IJ14, IJ15, IJ16, IJ19, IJ21, IJ23, IJ25, IJ26 |
| No nozzle plate | Various methods have been tried to eliminate the nozzles entirely, to prevent nozzle clogging. These include thermal bubble mechanisms and acoustic lens mechanisms | ♦ No nozzles to become clogged | ♦ Difficult to control drop position accurately<br>♦ Crosstalk problems | ♦ Ricoh 1995 Sekiya et al USP 5,412,413<br>♦ 1993 Hadimioglu et al EUP 550,192<br>♦ 1993 Elrod et al EUP 572,220 |
| Trough | Each drop ejector has a trough through which a paddle moves. There is no nozzle plate. | ♦ Reduced manufacturing complexity<br>♦ Monolithic | ♦ Drop firing direction is sensitive to wicking. | ♦ IJ35 |
| Nozzle slit instead of individual nozzles | The elimination of nozzle holes and replacement by a slit encompassing many actuator positions reduces nozzle clogging, but increases crosstalk due to ink surface waves | ♦ No nozzles to become clogged | ♦ Difficult to control drop position accurately<br>♦ Crosstalk problems | ♦ 1989 Saito et al USP 4,799,068 |

DROP EJECTION DIRECTION

| | Description | Advantages | Disadvantages | Examples |
|---|---|---|---|---|
| Edge ('edge shooter') | Ink flow is along the surface of the chip, and ink drops are ejected from the chip edge. | ♦ Simple construction<br>♦ No silicon etching required<br>♦ Good heat sinking via substrate<br>♦ Mechanically strong<br>♦ Ease of chip handing | ♦ Nozzles limited to edge<br>♦ High resolution is difficult<br>♦ Fast color printing requires one print head per color | ♦ Canon Bubblejet 1979 Endo et al GB patent 2,007,162<br>♦ Xerox heater-in-pit 1990 Hawkins et al USP 4,899,181<br>♦ Tone-jet |
| Surface | Ink flow is along the | ♦ No bulk Silicon | ♦ Maximum ink flow | ♦ Hewlett-Packard TIJ |

-continued

| | Description | Advantages | Disadvantages | Examples |
|---|---|---|---|---|
| ('roof shooter') | surface of the chip, and ink drops are ejected from the chip surface, normal to the plane of the chip. | ◆ etching required<br>◆ Silicon can make an effective heat sink<br>◆ Mechanical strength | is severely restricted | 1982 Vaught et al USP 4,490,728<br>◆ IJ02, IJ11, IJ12, IJ20, IJ22 |
| Through chip, forward ('up shooter') | Ink flow is through the chip, and ink drops are ejected from the front surface of the chip. | ◆ High ink flow<br>◆ Suitable for pagewidth print heads<br>◆ High nozzle packing density therefore low manufacturing cost | Requires bulk silicon etching | Silverbrook, EP 0771 658 A2 and related patent applications<br>◆ IJ04, IJ17, IJ18, IJ24, IJ27–IJ45 |
| Through chip, reverse ('down shooter') | Ink flow is through the chip, and ink drops are ejected from the rear surface of the chip. | ◆ High ink flow<br>◆ Suitable for pagewidth print heads<br>◆ High nozzle packing density therefore low manufacturing cost | ◆ Requires wafer thinning<br>◆ Requires special handling during manufacture | ◆ IJ01, IJ03, IJ05, IJ06, IJ07, IJ08, IJ09, IJ10, IJ13, IJ14, IJ15, IJ16, IJ19, IJ21, IJ23, IJ25, IJ26 |
| Through actuator | Ink flow is through the actuator, which is not fabricated as part of the same substrate as the drive transistors. | ◆ Suitable for piezoelectric print heads | ◆ Pagewidth print heads require several thousand connections to drive circuits<br>◆ Cannot be manufactured in standard CMOS fabs<br>◆ Complex assembly required | ◆ Epson Stylus<br>◆ Tektronix hot melt piezoelectric ink jets |

INK TYPE

| | Description | Advantages | Disadvantages | Examples |
|---|---|---|---|---|
| Aqueous, dye | Water based ink which typically contains: water, dye, surfactant, humectant, and biocide. Modern ink dyes have high water-fastness, light fastness | ◆ Environmentally friendly<br>◆ No odor | ◆ Slow drying<br>◆ Corrosive<br>◆ Bleeds on paper<br>◆ May strikethrough<br>◆ Cockles paper | ◆ Most existing ink jets<br>◆ All IJ series ink jets<br>◆ Silverbrook, EP 0771 658 A2 and related patent applications |
| Aqueous, pigment | Water based ink which typically contains: water, pigment, surfactant, humectant, and biocide. Pigments have an advantage in reduced bleed, wicking and strikethrough. | ◆ Environmentally friendly<br>◆ No odor<br>◆ Reduced bleed<br>◆ Reduced wicking<br>◆ Reduced strikethrough | ◆ Slow drying<br>◆ Corrosive<br>◆ Pigment may clog nozzles<br>◆ Pigment may clog actuator mechanisms<br>◆ Cockles paper | ◆ IJ02, IJ04, IJ21, IJ26, IJ27, IJ30<br>◆ Silverbrook, EP 0771 658 A2 and related patent applications<br>◆ Piezoelectric ink-jets<br>◆ Thermal ink jets (with significant restrictions) |
| Methyl Ethyl Ketone (MEK) | MEK is a highly volatile solvent used for industrial printing on difficult surfaces such as aluminum cans. | ◆ Very fast drying<br>◆ Prints on various substrates such as metals and plastics | ◆ Odorous<br>◆ Flammable | ◆ All IJ series ink jets |
| Alcohol (ethanol 2-butanol, and others) | Alcohol based inks can be used where the printer must operate at temperatures below the freezing point of water. An example of this is in-camera consumer photographic printing. | ◆ Fast drying<br>◆ Operates at sub-freezing temperatures<br>◆ Reduced paper cockle<br>◆ Low cost | ◆ Slight odor<br>◆ Flammable | ◆ All IJ series ink jets |
| Phase change (hot melt) | The ink is solid at room temperature, and is melted in the print head before jetting. Hot melt inks are usually wax based, with a melting point around 80° C. After jetting the ink freezes | ◆ No drying time- ink instantly freezes on the print medium<br>◆ Almost any print medium can be used<br>◆ No paper cockle occurs<br>◆ No wicking occurs<br>◆ No bleed occurs | ◆ High viscosity<br>◆ Printed ink typically has a 'waxy' feel<br>◆ Printed pages may 'block'<br>◆ Ink temperature may be above the curie point of permanent magnets | ◆ Tektronix hot melt piezoelectric ink jets<br>◆ 1989 Nowak USP 4,820,346<br>◆ All IJ series ink jets |

-continued

| | Description | Advantages | Disadvantages | Examples |
|---|---|---|---|---|
| | almost instantly upon contacting the print medium or a transfer roller. | ◆ No strikethrough occurs | ◆ Ink heaters consume power<br>◆ Long warm-up time | |
| Oil | Oil based inks are extensively used in offset printing. They have advantages in improved characteristics on paper (especially no wicking or cockle). Oil soluble dies and pigments are required. | ◆ High solubility medium for some dyes<br>◆ Does not cockle paper<br>◆ Does not wick through paper | ◆ High viscosity: this is a significant limitation for use in ink jets, which usually require a low viscosity. Some short chain and multi-branched oils have a sufficiently low viscosity.<br>◆ Slow drying | ◆ All IJ series ink jets |
| Micro-emulsion | A microemulsion is a stable, self forming emulsion of oil, water, and surfactant. The characteristic drop size is less than 100 nm, and is determined by the preferred curvature of the surfactant. | ◆ Stops ink bleed<br>◆ High dye solubility<br>◆ Water, oil, and amphiphilic soluble dies can be used<br>◆ Can stabilize pigment suspensions | ◆ Viscosity higher than water<br>◆ Cost is slightly higher than water based ink<br>◆ High surfactant concentration required (around 5%) | ◆ All IJ series ink jets |

We claim:

1. A method of manufacture of an ink jet printer which includes a trough having side walls and an exposed roof, said trough being substantially filled with fluid during operations; a paddle vane located within the trough and offset from one wall when said paddle vane is in a quiescent position; an actuation mechanism attached to said paddle vane such that, upon activation of said actuation mechanism, said paddle vane is caused to move towards said one wall, resulting in an increase in pressure in the fluid between said one wall and said paddle vane, resulting in a consequential ejection of fluid via said exposed roof, said method comprising the steps of:

(a) initially providing a silicon wafer having a circuitry wafer layer including electrical circuitry necessary for the operation of the actuation mechanism on demand;

(b) etching said trough in the surface of said wafer;

(c) creating said actuation mechanism and said paddle vane on said silicon wafer by means of depositing and etching a series of sacrificial layers to form a supporting structure for said actuation mechanism and said paddle vane, in addition to depositing and suitably etching a series of materials for forming said actuation mechanism and said paddle vane;

(d) etching an ink supply channel interconnecting said trough through said wafer with an ink supply reservoir; and (e) etching away any remaining sacrificial layers so as to release said actuation mechanism and said paddle vane for operation.

2. A method as claimed in claim 1 wherein step (c) comprises the steps of:

(i) depositing and etching a first series of sacrificial layers to form a first supporting structure;

(ii) depositing and etching a conductive material to form a first conductive portion of said actuation mechanism and said paddle vane;

(iii) depositing and etching a second series of sacrificial layers to form a second supporting structure for a non-conductive portion of said actuation mechanism;

(iv) depositing and etching a non-conductive material to form those non-conductive portions of said actuation mechanism;

(v) depositing and etching a third series of sacrificial layers to form a third supporting structure for said actuation mechanism; and (vi) depositing and etching a second conductive material to form a second conductive portion of said actuation mechanism and said paddle vane.

3. A method as claimed in claim 1 wherein said first and second conductive material comprises substantially titanium diboride.

4. A method as claimed in claim 1 wherein said non-conductive material comprises substantially silicon nitride.

5. A method as claimed in claim 1 wherein said sacrificial layers comprises substantially glass and aluminum.

6. A method as claimed in claim 1 wherein said wafer comprises a double sided polished CMOS wafer.

7. A method as claimed in claim 1 wherein at least step (e) is also utilized to simultaneously separate said wafer into separate printheads.

* * * * *